US007457186B2

(12) United States Patent
Ohsawa

(10) Patent No.: US 7,457,186 B2
(45) Date of Patent: Nov. 25, 2008

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 11/539,447

(22) Filed: Oct. 6, 2006

(65) Prior Publication Data
US 2007/0133330 A1 Jun. 14, 2007

(30) Foreign Application Priority Data
Dec. 8, 2005 (JP) ............................. 2005-354753

(51) Int. Cl.
*G11C 7/00* (2006.01)
(52) U.S. Cl. .................... 365/222; 365/182; 365/185.25
(58) Field of Classification Search ................. 365/222, 365/182, 185.25, 236, 154
See application file for complete search history.

(56) References Cited

U.S. PATENT DOCUMENTS

| 6,081,443 | A | 6/2000 | Morishita et al. | |
|---|---|---|---|---|
| 6,628,560 | B2 * | 9/2003 | Dosaka | 365/222 |
| 6,965,526 | B2 * | 11/2005 | Cavaleri et al. | 365/185.29 |
| 2004/0141396 | A1 | 7/2004 | Ting et al. | |
| 2005/0152201 | A1 * | 7/2005 | Takahashi | 365/222 |
| 2005/0195680 | A1 | 9/2005 | Higashi et al. | |
| 2007/0070745 | A1 * | 3/2007 | Versen et al. | 365/203 |

OTHER PUBLICATIONS

S. Okhonin, et al., "Principles of Transient Charge Pumping on Partially Depleted SOI MOSFETs", IEEE Electron Device Letters, vol. 23, No. 5, May 2002, pp. 279-281.
U.S. Appl. No. 11/331,169, filed Jan. 13, 2006, Takashi Ohsawa.

* cited by examiner

*Primary Examiner*—Dang T Nguyen
(74) *Attorney, Agent, or Firm*—Oblon, Spivak, McClelland, Maier & Neustadt, P.C.

(57) ABSTRACT

The disclosure concerns a semiconductor memory device includes a memory cell array including memory cells; word lines; bit lines; a counter cell array including counter cells provided corresponding to the word lines and storing the number of times of activating the word lines; an adder incrementing the number of times of activating the word lines which is read out from the counter cell array, when data is read or written in the memory cell; a counter buffer circuit temporarily storing the number of times of activating the word lines, and writing back the incremented number of times of activating the word lines into the counter cell array; and a sense amplifier executing a refresh operation during a data read cycle or a data write cycle, when the number of times of activating one of the word lines has reached a predetermined value.

20 Claims, 28 Drawing Sheets

HA$_i$

NORMAL REFRESH OPERATION

READ/WRITE OPERATION, WITH AD HOC REFRESH OPERATION

SEMICONDUCTOR MEMORY DEVICE

CROSS-REFERENCE TO RELATED APPLICATION

This application is based upon and claims the benefit of priority from the prior Japanese Patent Applications No. 2005-354753, filed on Dec. 8, 2005, the entire contents of which are incorporated herein by reference.

BACKGROUND OF THE INVENTION

1. Field of the Invention

The present invention relates to a semiconductor memory device.

2. Related Art

Recently, an FBC (Floating Body Cell) memory device is available as a semiconductor memory device that is expected as an alternative memory to a DRAM. The FBC memory device has an N-type MOS transistor having a floating body (hereinafter, also "body region") on an SOI (Silicon On Insulator) substrate, and stores data "1" or data "0" depending on the number of holes stored in the body region. For example, when the number of holes within the body region is large, the data is "1" and when the number of holes is small, the data is "0".

An FBC memory cell constituted by an FET (Field Effect Transistor) has the following problem called a charge pumping phenomenon. When the memory cell is an N-type FET, a part of electrons within an inversion layer in an on-state of the memory cell is trapped in an interface state at the interface between a gate oxide film and the body region. Holes stored in the body region are recombined with electrons, and disappear. Normally, when a word line is activated between a certain refresh operation and a next refresh operation, data is not rewritten into an unselected FBC memory cell which is selected by a word line but is not read from or written into. Therefore, when on and off of the unselected memory cell is repeated during reading and writing of data in a selected memory cell, holes that are stored in the body region of the unselected memory cell storing the data "1" gradually decrease. As a result, the data "1" in the unselected memory cell changes to the data "0".

Accordingly, although the FBC memory is not a destructive read-out cell unlike a DRAM, it cannot be called a complete non-destructive read-out cell either. In other words, it has become apparent that the FBC memory is a quasi non-destructive read-out cell.

SUMMARY OF THE INVENTION

A semiconductor memory device according to an embodiment of the present invention comprises memory cells including floating bodies in an electrically floating state and storing data depending on the number of majority carriers within the floating bodies; a memory cell array including the memory cells disposed two dimensionally; word lines connected to the memory cell arrayed in rows of the memory cell array; bit lines connected to the memory cell arrayed in columns of the memory cell array; a counter cell array including counter cells provided corresponding to the word lines and storing the number of times of activating the word lines; an adder incrementing the number of times of activating the word lines which is read out from the counter cell array, when data is read or written in the memory cell; a counter buffer circuit temporarily storing the number of times of activating the word lines which is read out from the counter cell array, and writing back the incremented number of times of activating the word lines into the counter cell array; and a sense amplifier executing a refresh operation for at least one polarity data during a data read cycle or a data write cycle, when the number of times of activating one of the word lines has reached a predetermined value, the refresh operation being an operation in which data is readout and the data readout is written back into the memory cell originally stored the data.

DETAILED DESCRIPTION OF THE INVENTION

Embodiments of the present invention will be explained below with reference to the accompanying drawings. The invention is not limited to the embodiments.

First Embodiment

Figure 1:
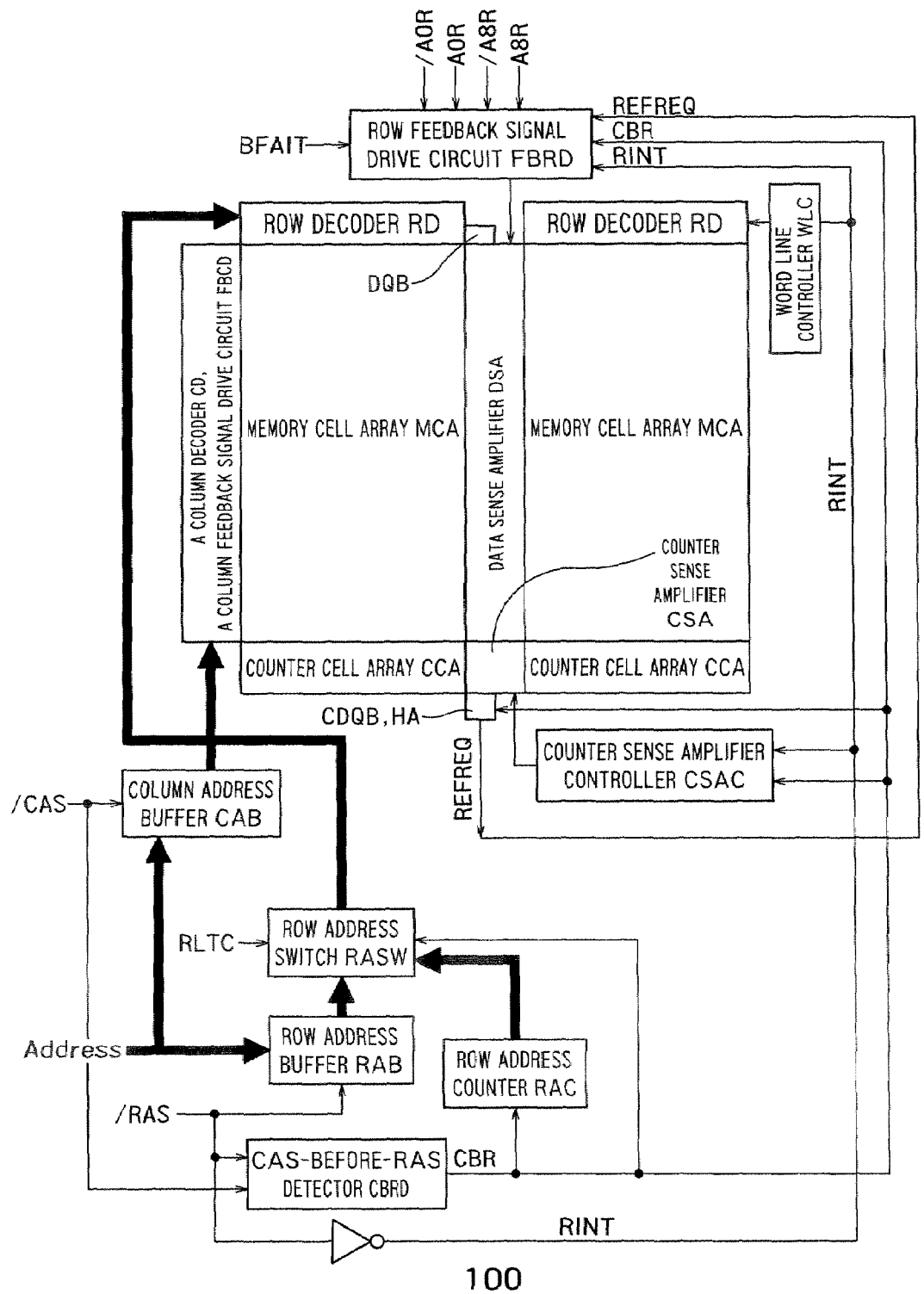
FIG. 1 is a block diagram showing a configuration of an FBC memory 100 according to a first embodiment of the present invention.

FIG. 1 is a block diagram showing a configuration of an FBC memory 100 according to a first embodiment of the present invention. The FBC memory 100 includes: memory cell arrays MCAs; counter cell arrays CCAs; a data sense amplifier DSA that is provided between the adjacent memory cell arrays MCAs; a counter sense amplifier CSA that is provided between the adjacent counter cell arrays CCAs; a row decoder RD; a column decoder CD; a column feedback signal drive circuit (hereinafter, "column feedback circuit") FBCD; a row feedback signal drive circuit (hereinafter, "row feedback circuit") FBRD; a DQ buffer DQB; a counter DQ buffer CDQB; a half adder HA; a counter sense amplifier controller CSAC; a word line controller WLC; a column address buffer CAB; a row address buffer RAB; a row address counter RAC; a row address switch RASW; and a CAS-before-RAS detector CBRD.

The row decoder RD receives a row address from the row address buffer RAB via the row address switch RASW. The row decoder RD selects a word line of the memory cell array MCA and the counter cell array CCA following the row address. The column decoder CD receives a column address from the column address buffer CAB. The column decoder CD selects a bit line of the memory cell array MCA following the column address. A memory cell that is connected to a selected word line and a selected bit line, that is, a memory cell that is positioned at an intersection of the selected word line and the selected bit line, becomes a selected memory cell in which data is to be read and written. Among memory cells that are connected to the selected word line, memory cells other than the selected memory cell are unselected memory cells.

The row address buffer RAB is configured to be able to temporarily store the address of a selected word line. The column address buffer CAB is configured to be able to temporarily store the address of a selected bit line.

During the read/write operation, the row address switch RASW transmits a row address stored in the row address buffer RAB to the row decoder RD. The read/write operation is an operation of reading data of the memory cell MC and outputting this data to the outside via the DQ buffer, or an operation of writing new data into the memory MC, thereby updating the data.

During a normal periodical refresh operation, the row address switch RASW receives the CAS-before-RAS signal CBR, and transmits a row address stored in the row address counter RAC to the row decoder RD. The refresh operation is an operation of once reading data from the total memory cells MCs connected to the activated word line, and writing back the same data to the same memory cells.

The CAS-before-RAS detector CBRD inputs a signal /CAS (bar CAS) and a signal /RAS (bar RAS), and outputs a signal CBR to the row address counter RAC, the row address switch RASW, the counter sense amplifier controller CSAC, the counter DQ buffer CDQB, and the row feedback circuit FBRD, during the normal refresh operation. This signal CBR becomes a sign of the normal refresh operation. ("/(bar)" added to signal name indicates a reverse signal of the original signal.)

The counter DQ buffer CDQB and the half adder HA are connected to the counter sense amplifier CSA. The counter sense amplifier CSA amplifies digital data corresponding to the number of times when a certain word line is activated (hereinafter, also "the number of times of activation"). When a word line is activated, the counter DQ buffer CDQB and the half adder HA increment the number of times when the word line is activated, and write back the incremented number to the counter sense amplifier CSA. When the number of times of activation reaches a predetermined value, the counter DQ buffer CDQB outputs a refresh request signal REFREQ. The signal REFREQ is used to execute an ad hoc refresh operation separate from the normal periodical refresh, during the read/write operation.

The signal REFREQ is transmitted to the row feedback circuit FBRD. During the ad hoc refresh time (when the signal REFREQ is active), the row feedback circuit FBRD controls the data sense amplifier DSA to write back the data into the unselected memory cells MCs as well as into the selected memory cell MC. During the read/write operation, the column feedback circuit FBCD controls the data sense amplifier DSA to write back the data into only the selected memory cell MC. During the normal refresh time (i.e., when the signal CBR is active), the row feedback circuit FBRD controls the data sense amplifier DSA to write back the data into all the memory cells MCs.

An internal RAS signal RINT is an inversion signal of the signal /RAS, and is transmitted to the word line controller WLC, the counter sense amplifier controller CSAC, and the row feedback circuit FBRD. The internal RAS signal RINT is used to execute a read/write operation and a normal refresh operation.

Figure 2:
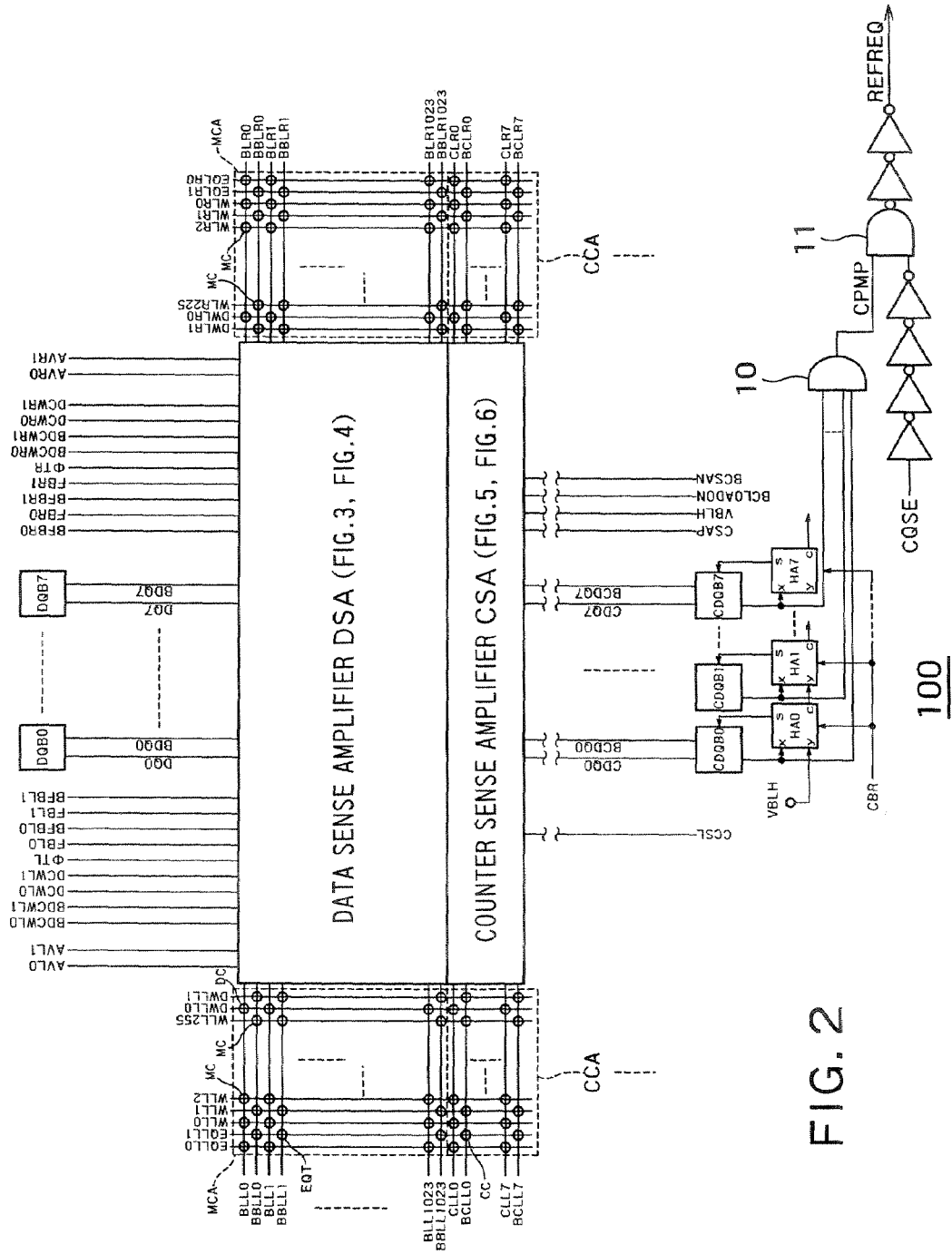
FIG. 2 is a circuit diagram showing details of the configuration of the FBC memory 100.

FIG. 2 is a circuit diagram showing details of the configuration of the FBC memory 100. Details of the data sense amplifier DSA are described later with reference to FIG. 3 and FIG. 4. Details of the counter sense amplifier CSA are described later with reference to FIG. 5 and FIG. 6.

Plural data bit lines are provided at both sides of one data sense amplifier DSA. Data bit lines BLL0 to BLL1023 and BBLL0 to BBLL1023 are provided at one side of the data sense amplifier DSA, and data bit lines BLR0 to BLR1023 and BBLR0 to BBLR1023 are provided at the other side of the data sense amplifier DSA. 256 word lines WLL0 to WLL255 are provided at one side of one data sense amplifier DSA, and 256 word lines WLR0 to WLR255 are provided at the other side of the data sense amplifier DSA.

Counter bit lines CLL0 to CLL7 and BCLL0 to BCLL7 are provided at one side of the counter sense amplifier CSA, and counter bit lines CLR0 to CLR7 and BCLR0 to BCLR7 are provided at the other side of the counter sense amplifier CSA. The word lines WLL0 to WLL255 and WLR0 to WLR255 common to the data sense amplifier DSA are extended at both sides of the counter sense amplifier CSA.

The memory cell array MCA and the counter cell array CCA are provided at both sides of the data sense amplifier DSA and the counter sense amplifier CSA. The memory cell array MCA and the counter cell array CCA that are provided at one side of the data sense amplifier DSA and the counter sense amplifier CSA have configurations similar to those of the memory cell array MCA and the counter cell array CCA that are provided at the other side of the data sense amplifier DSA and the counter sense amplifier CSA respectively. Therefore, the memory cell array MCA and the counter cell array CCA that are provided at one side of the data sense amplifier DSA and the counter sense amplifier CSA are explained below, and explanation of the memory cell array MCA and the counter cell array CCA that are provided at the other side is omitted.

The memory cell MC and the counter cell CC are provided at every other intersection of the word line and the bit line. The memory cell MC is an FBC (Floating Body Cell) memory having a floating body region. The FBC memory cell can store data "0" or data "1" depending on the number of majority carriers stored in the floating body region. The counter cell CC has a configuration similar to that of the memory cell MC. In this embodiment, the memory cells MCs are provided at intersections of even-number word lines WLL0, WLL2, WLL4, and the like, and the data bit lines BLLk (k=0 to 1023), and at intersections of odd-number word lines WLL1, WLL3, WLL5, and the like, and the data bit lines BBLLk (k=0 to 1023), respectively. In other words, in this embodiment, the FBC memory 100 has a folded bit line configuration. Therefore, when the data bit lines BLLk and BBLLk form one bit line pair, data can be stored in memory cells MCs of a number equivalent to the number of bit line pairs×the number of word lines. During the read/write operation, data can be read or written simultaneously in eight bit line pairs.

The memory cell array MCA at one side of the data sense amplifier DSA shown in FIG. 2 can store data of 1024×256 bits. The counter cell CCs are provided at intersections of the even-number word lines WLL0, WLL2, WLL4, and the like, and the counter bit lines CLLi (i=0 to 7), and at intersections of the odd-number word lines WLL1, WLL3, WLL5, and the like, and the counter bit lines BCLLi (i=0 to 7), respectively. Viewed from a row direction, eight counter cells CCs are connected to one word line WLLj (j=0 to 255). With this arrangement, the number of times of activating the word line WLLj can be stored as 8-bit data.

Equalize signal lines EQLL0 and EQLL1 are further wired to the memory cell array MCA and the counter cell array CCA. An equalize transistor EQT that short-circuits the bit lines BLLk and BBLLk to a source potential of the memory cell MC is connected to the equalize signal lines EQLL0 and EQLL1. This equalize transistor EQT is disposed at every other intersection of the equalize signal line and the bit line. The equalize transistor EQT has the same configuration as that of the memory cell MC.

Dummy word lines DWLL0 and DWLL1 are further wired to the memory cell array MCA and the counter cell array CCA. A dummy cell DC is connected to the dummy word lines DWLL0 and DWLL1. The dummy cell DC is disposed at every other intersection of the dummy word line and the bit line. The data "1" and the data "0" are written alternately in the dummy cells DCs along the direction of the dummy word lines DWLL0 and DWLL1. The data of the dummy cell DC is used to generate a reference signal at the time of reading the data of the memory cell MC. The dummy cell DC also has the same configuration as that of the memory cell MC.

The DQ buffers DQB0 to DQB7 further amplify the data that are amplified and detected by the data sense amplifier DSA. The counter DQ buffers CDQB0 to CDQB7 further amplify the data of the number of times of activation that is amplified and detected by the counter sense amplifier CSA. The half adders HA0 to HA7 are provided corresponding to the counter DQ buffers CDQB0 to CDQB7, respectively. The half adders HA0 to HA7 increment the number of times of activation of the word line WLj read from the counter cell array CCA, each time when data is read from the memory cell MC or each time when data is written into the memory cell MC, during the normal read/write operation. The counter DQ buffers CDQB0 to CDQB7 write back the incremented number of times of activation into the counter cell array. Therefore, the counter DQ buffers CDQB0 to CDQB7 also function as writing circuits of the number of times of activation. The number of times of activation is stored in the counter cell array CCA in binary numbers.

An output of the counter DQ buffers CDQB0 to CDQB7 respectively is connected to one AND gate 10. When the output of the counter DQ buffers CDQB0 to CDQB7 becomes a predetermined value, the AND gate 10 outputs a high level (HIGH) to execute a refresh operation to the memory cell MC connected to the word line WLj. For example, when the prescribed number of times when the word line WLj is activated is 256, the AND gate 10 outputs HIGH when the output of the counter DQ buffers CDQB0 to CDQB7 becomes "11111111", respectively. This refresh operation is executed during a period different from that of the normal periodical refresh operation. Therefore, this operation is hereinafter called an "ad hoc refresh operation".

When the output of the counter DQ buffers CDQB0 to CDQB7 is less than the predetermined value, the AND gate 10 outputs a low level (LOW). In this case, the ad hoc refresh operation is not executed.

A signal CQSE becomes HIGH at the time of determining whether the number of times of activation has reached a predetermined value, and the signal CQSE is maintained at LOW during other periods. When the AND gate 10 outputs HIGH during a period when the signal CQSE is HIGH, LOW is output as the refresh request signal REFREQ. When the AND gate 10 outputs LOW during a period when the signal CQSE is HIGH, HIGH is output as the refresh request signal REFREQ. In other words, the refresh request signal REFREQ is inactive (HIGH) when the number of times of activation is less than a predetermined value, and becomes active (LOW) when the number of times of activation reaches the predetermined value.

A relationship between the number of times of activating the word line and a charge pumping phenomenon is explained next. For example, assume that an interface state density between silicon and a silicon oxide film is about $N_{it}=1\times10^{10}$ cm$^{-2}$, and that a gate width (W)/a gate length (L) of the memory cell MC is equal to 0.1 μm/0.1 μm. In this case, the area of the interface between a body region and a gate insulation film becomes about $1.0\times10^{-10}$ cm$^2$ per one memory cell MC, and the interface state per one memory cell MC becomes about one on the average. Therefore, the number of holes that decreases within the memory cell MC when the word line is activated once is about one on the average.

In the FBC memory, a difference between the number of holes of the data "1" and the number of holes of the data "0" is about 1,000. Therefore, in theory, when the number of times of activating the word line becomes about 1,000, the data "1" is completely changed to the data "0". In actual practice, when the number of times of activating the word line becomes about 500, there is a high risk that the data "1" is detected by error. Substantially, when the number of times of activating the word line exceeds 200 to 500, it will be necessary to refresh all memory cells MCs that are connected to the word line. Therefore, in this embodiment, the ad hoc refresh operation is executed when the number of times of activating the word line WLj exceeds 256. As a result, the erroneous detection of the data "1" due to the charge pumping phenomenon can be suppressed.

Figure 3:
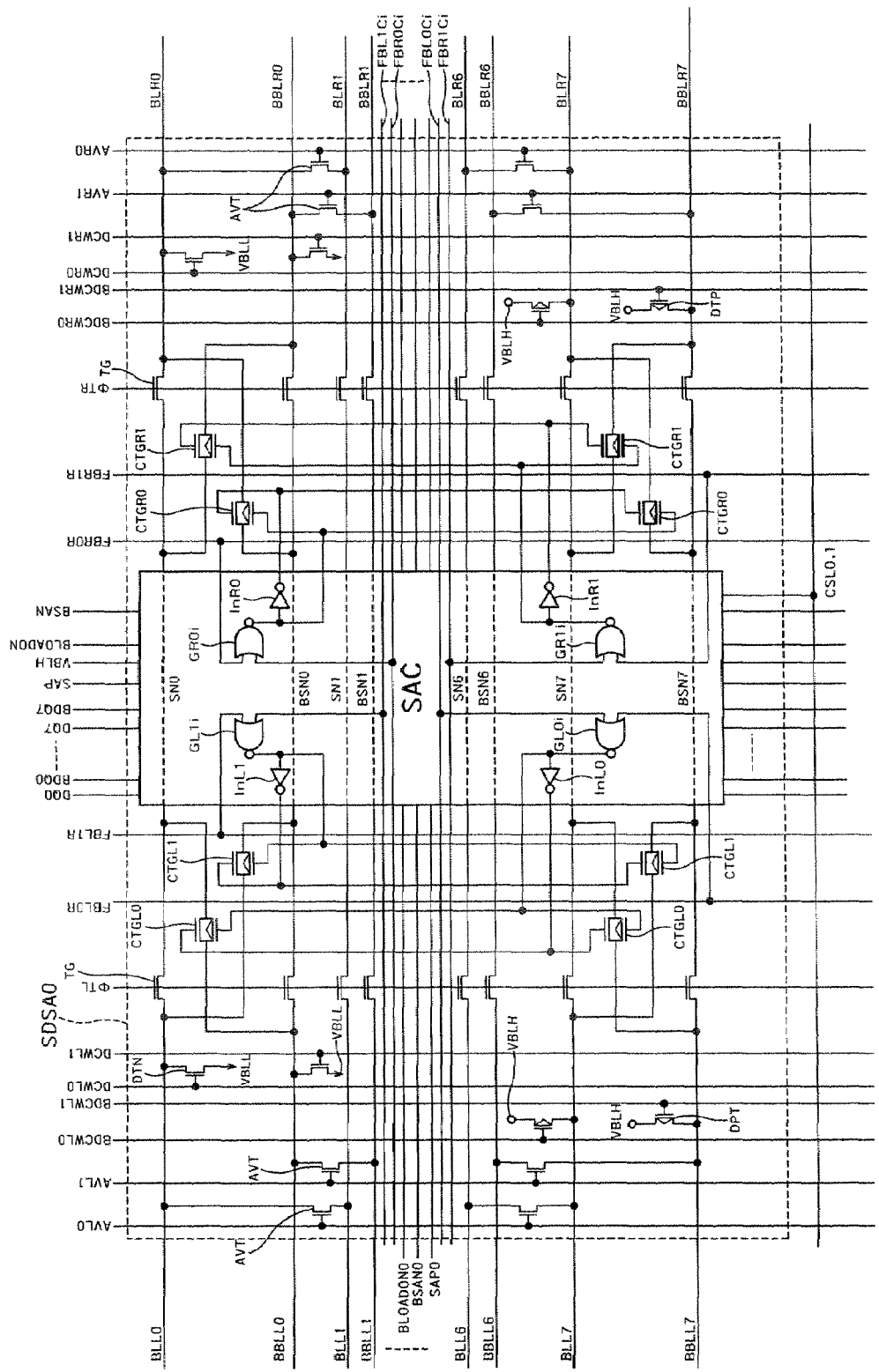
FIG. 3 is a circuit diagram showing details of a part of a data sense amplifier DSA.

FIG. 3 is a circuit diagram showing details of a part of the data sense amplifier DSA. The data sense amplifier DSA has plural structures of the same structure as that shown in FIG. 3, in a row direction.

The eight bit line pairs BLL0 to BLL7 and one data sense amplifier DSA are explained below. The data bit lines BLL0 to BLL7 are connected to sense nodes SN0 to SN7, respectively, via an NMOS transfer gate TG. The data bit lines BBLL0 to BBLL7 are connected to sense nodes BSN0 to BSN7, respectively, via the NMOS transfer gate TG. Each transfer gate TG is controlled by a signal φTL, and can electrically connect between each data bit line and a corresponding sense node.

CMOS transfer gates CTGL0 and CTGL1 can connect each sense node SNi (i=0 to 7) to the data bit line BBLLi, and connect each sense node BSNi to the data bit line BLLi. The CMOS transfer gates CTGL0 and CTGL1 are constituted by an NMOS and a PMOS that are connected in parallel with each other. The CMOS transfer gates CTGL0 and CTGL1 are controlled by output signals of the NOR gates GL0 and GL1 and their inverted signals, respectively.

The NOR gate GL0i receives a signal FBL0Ci from a signal line that extends in a column direction, and receives a signal FBL0R from a signal line that extends in a row direction. The NOR gate GL0i outputs a result of an NOR operation of the signal FBL0Ci and the signal FBL0R to a gate of a transfer gate CTGL0. The NOR gate GL1i receives a signal FBL1Ci from a signal line that extends in a column direction, and receives a signal FBL1R from a signal line that extends in a row direction. The NOR gate GL1i outputs a result of an NOR operation of the signal FBL1Ci and the signal FBL1R to a gate of a transfer gate CTGL1. The NOR gate GR0i receives a signal FBR0Ci from a signal line that extends in a column direction, and receives a signal FBR0R from a signal line that extends in a row direction. The NOR gate GR0i outputs a result of an NOR operation of the signal FBR0Ci and the signal FBR0R to a gate of the transfer gate CTGR0. The NOR gate GR1i receives a signal FBR1Ci from a signal line that extends in a column direction, and receives a signal FBR1R from a signal line that extends in a row direction. The NOR gate GR1i outputs a result of an NOR operation of the signal FBR1Ci and the signal FBR1R to a gate of the transfer gate CTGR1.

PMOSs of the CMOS transfer gates CTGL0, CTGL1, CTGR0, and CTGR1, respectively input output signals of the NOR gates GL0i, GL1i, GR0i, and GR1i, respectively. NMOSs of the CMOS transfer gates CTGL0, CTGL1, CTGR0, and CTGR1, respectively receive inverted signals of the output signals of the NOR gates GL0i, GL1i, GR0i, and GR1i, respectively. Therefore, the CMOS transfer gates CTGL0, CTGL1, CTGR0, and CTGR1, respectively are controlled to be on or off. The NOR gates GL0i, GL1i, GR0i, and GR1i, and inverters InL0, InL1, InR0, and InR1 that are connected to these NOR gates respectively can be provided either in the inside or at the outside of the sense amplifier core SAC.

By receiving the control of the signals FBL0R, FBL1R, FBR0R, FBR1R, FBL0Ci, FBL1Ci, FBR0Ci, and FBR1Ci, respectively, the transfer gates CTGL0, CTGL1, CTGR0, and CTGR1, and the inverters InL0, InL1, InR0, and InR1 can write back data into only a selected memory cell MC during a read/write operation, or can write back data into both a selected memory cell and unselected memory cells during a normal refresh period or an ad hoc refresh period. However, during the normal refresh period, the concept of selected and unselected is not present, and the memory cells MCs that are connected to all word lines receive a refresh operation in the order of addresses. The signals FBL0R, FBL1R, FBR0R, and FBR1R are used in common to plural sense amplifiers SAs.

The signals FBL0Ci, FBL1Ci, FBR0Ci, and FBR1Ci are provided for each eight sense amplifiers SAs.

When the signals FBL0R, FBL1R, FBR0R, FBR1R, FBL0Ci, FBL1Ci, FBR0Ci, and FBR1Ci are all LOW, all the transfer gates CTGL0, CTGL1, CTGR0, and CTGR1 are in the off state. When the signal FBL0R or FBL0Ci becomes HIGH, the transfer gate CTGL0 becomes on. When the signal FBL1R or FBL1Ci becomes HIGH, the transfer gate CTGL1 becomes on. When the signal FBR1R or FBR0Ci becomes HIGH, the transfer gate CTGR1 becomes on. When the signal FBR1R or FBR1Ci becomes HIGH, the transfer gate CTGR1 becomes on.

An average transistor AVT is provided between the adjacent data bit line BLLs and between the adjacent data bit lines BBLLs, respectively. For example, the average transistor AVT is provided between the data bit line BLLi and the data bit line BLL (i+1), and between the data bit line BBLLi and the data bit line BBLL (i+1), respectively. This average transistor AVT is used to generate a reference signal by connecting the data "1" and the data "0" from the dummy cell DC.

Further, an NMOS transistor DTN for writing data to a dummy cell is connected between the data bit lines BLLi and BBLLi whose i are even numbers and a low voltage source VBLL. With this arrangement, the data "0" can be written into a dummy cell DC that is connected to the data bit lines BLLi and BBLLi whose i are even numbers. A PMOS transistor DTP for writing data to a dummy cell is connected between the data bit lines BLLi and BBLLi whose i are odd numbers and a high voltage source VBLH. With this arrangement, the data "1" can be written into a dummy cell DC that is connected to the data bit lines BLLi and BBLLi whose i are odd numbers.

Figure 4:
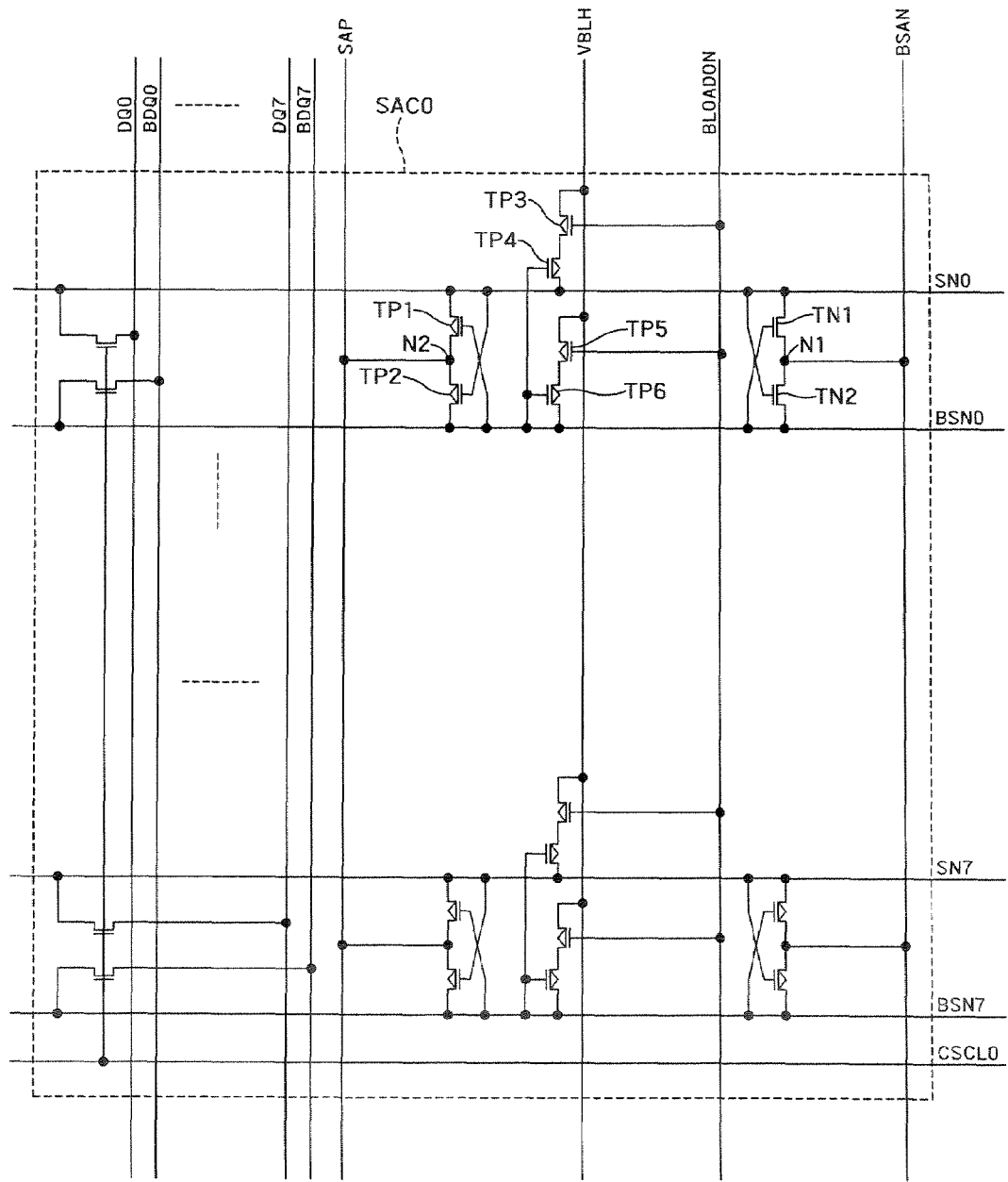
FIG. 4 is a circuit diagram showing details of the inside of a sense amplifier core SAC shown in FIG. 3.

FIG. 4 is a circuit diagram showing details of the inside of the sense amplifier core SAC shown in FIG. 3. NMOS transistors TN1 and TN2 are connected in series between sense nodes NSi and BSNi. A node N1 between the NMOS transistors TN1 and TN2 is connected to a signal line BSAN. Gates of the transistors TN1 and TN2 are connected to the signal lines BSN0 and SN0, respectively. In other words, the gates of the transistors TN1 and TN2 are cross-coupled.

PMOS transistors TP1 and TP2 are also connected in series between sense nodes NSi and BSNi. A node N2 between the PMOS transistors TP1 and TP2 is connected to a signal line SAP. Gates of the transistors TP1 and TP2 are connected to respective signal lines BSN0 and SN0. In other words, the gates of the transistors TP1 and TP2 are cross-coupled.

PMOS transistors TP3 and TP4 are connected in series between the high voltage source VBLH and the sense node SN0. The PMOS transistors TP5 and TP6 are connected in series between the high voltage source VBLH and the sense node BSN0. Gates of the transistors TP3 and TP5 are connected to a signal line BLOADON. Gates of the transistors TP4 and TP6 are connected in common to the sense node BSN0. With this arrangement, the transistors TP3 and TP4 and the transistors TP5 and TP6 constitute a current mirror between the sense nodes SN0, BSN0 and the high voltage source VBLH.

The sense nodes SN0 to SN7 and BSN0 to BSN7 are connected to the data input and output lines DQ0 to DQ7 and BDQ0 to BDQ7 via NMOSs, respectively. These NMOSs are controlled by a column selection line CSL0.

Figure 5:
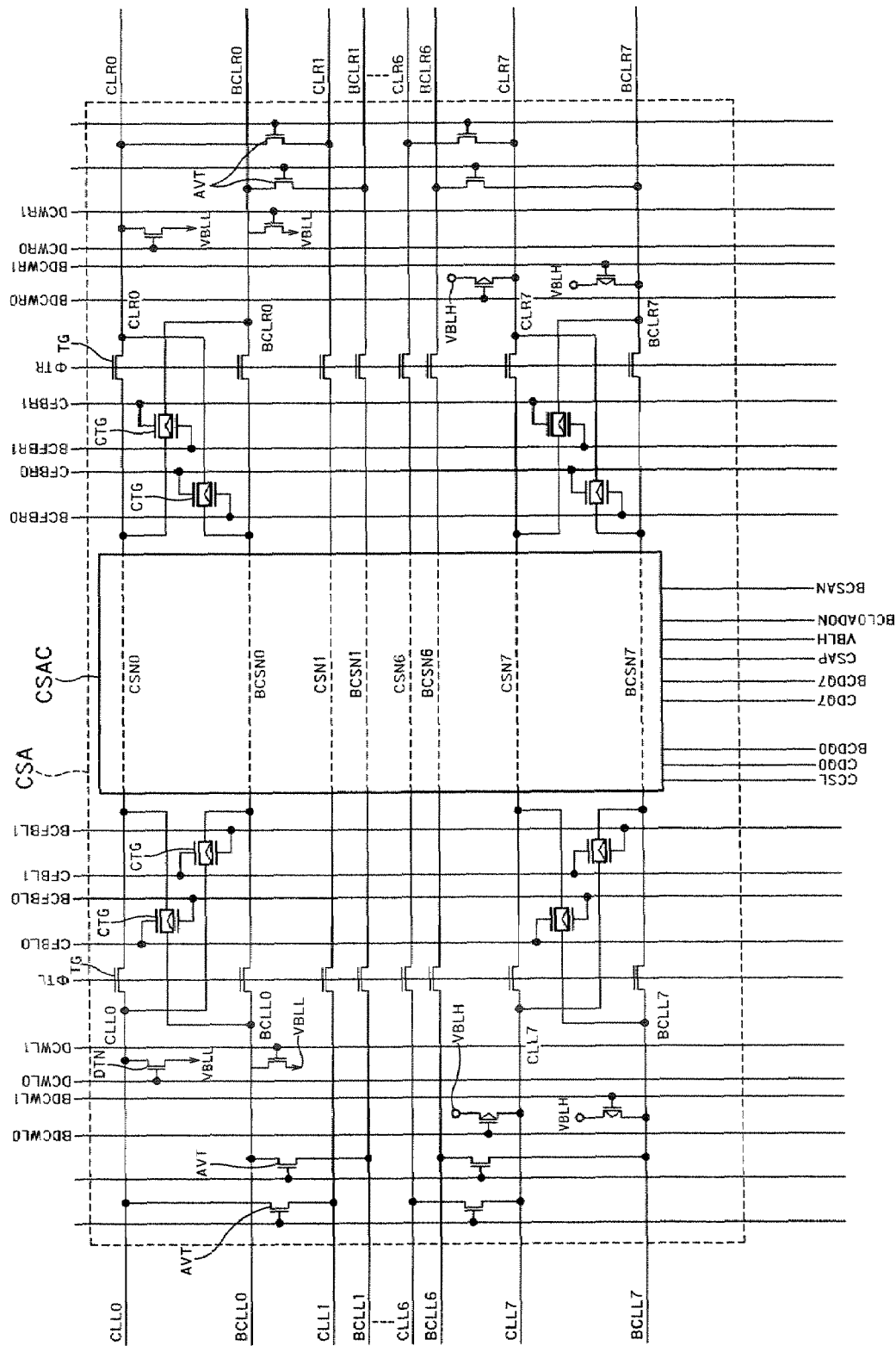
FIG. 5 is a circuit diagram showing details of the inside of a counter sense amplifier CSA.

FIG. 5 is a circuit diagram showing details of the inside of the counter sense amplifier CSA. The counter sense amplifier CSA is different from the data sense amplifier DSA shown in FIG. 3 in that the NOR gates GL0, GL1, GR0, and GR1 and the inverters InL0, InL1, InR0, and InR1 are not provided in the counter sense amplifier CSA. The transfer gate CTG is controlled by signals CFBL0, BCFBL0, CFBL1, BCFBL1, CFBR0, BCFBR0, CFBR1, and BCFBR1. The counter sense amplifier CSA is controlled by exclusive drive signals BCSAN, CSAP, BCLOADON, CCSL, CDQ0 to CDQ7, and BCDQ0 to BCDQ7.

One counter sense amplifier CSA is provided for each of eight pairs of counter bit lines CLLi and BCLLi, respectively. The counter sense amplifier CSA is provided to count the number of times of activating a word line. Therefore, one counter sense amplifier CSA is provided for one set of word lines WLL0 to WLL255.

The counter bit lines CLL0 to CLL7 are connected to the sense nodes CSN0 to CSN7 via the NMOS transfer gate TG, respectively. The counter bit lines BCLL0 to BCLL7 are connected to the sense nodes BCSN0 to BCSN7 via the NMOS transfer gate TG, respectively. Each transfer gate TG is controlled by a signal φTL, and can electrically connect each counter bit line to a corresponding sense node.

The CMOS transfer gate CTG can connect each sense node CSNi to the counter bit line BCLLi, and connect each sense node BCSNi to the counter bit line CLLi.

An average transistor AVT is provided between the adjacent counter bit lines CLLs and between the adjacent counter bit lines BCLLs, respectively. For example, the average transistor AVT is provided between the counter bit line CLLi and the counter bit line CLL (i+1), and between the counter bit line BCLLi and the counter bit line BCLL (i+1), respectively. This average transistor AVT is used to generate a reference signal by connecting the data "1" and the data "0" from the dummy cell DC.

Further, NMOS transistor DTN for a dummy cell is connected between the counter bit lines CLLi and BCLLi whose i are even numbers and the low voltage source VBLL. With this arrangement, the data "0" can be written into a dummy cell DC that is connected to the counter bit lines CLLi and BCLLi whose i are even numbers. A PMOS transistor DTP for a dummy cell is connected between the counter bit lines CLLi and BCLLi whose i are odd numbers and the high voltage source VBLH. With this arrangement, the data "1" can be written into a dummy cell DC that is connected to the counter bit lines CLLi and BCLLi whose i are odd numbers.

Figure 6:
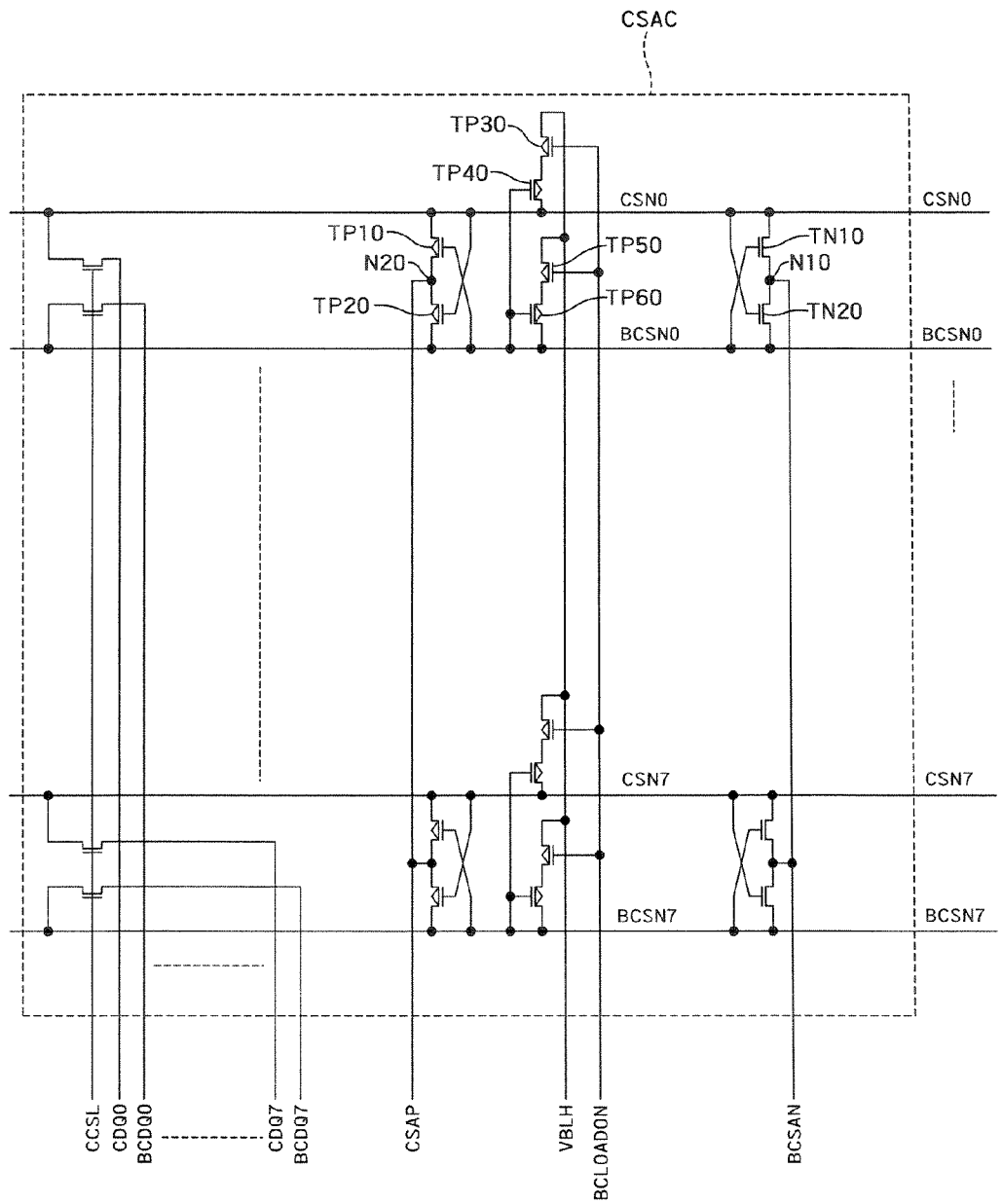
FIG. 6 is a circuit diagram showing details of the inside of a counter sense amplifier core CSAC shown in FIG. 5.

FIG. 6 is a circuit diagram showing details of the inside of the counter sense amplifier core CSAC shown in FIG. 5. The counter sense amplifier core CSAC is basically similar to the sense amplifier core SAC0 shown in FIG. 4.

NMOS transistors TN10 and TN20 are connected in series between sense nodes CNSi and BCSNi. A node N10 between the NMOS transistors TN10 and TN20 is connected to a signal line BCSAN. Gates of the transistors TN1 and TN2 are cross-coupled.

PMOS transistors TP10 and TP20 are also connected in series between the sense nodes CNSi and BCSNi. A node N20 between the PMOS transistors TP10 and TP20 is connected to a signal line CSAP. Gates of the transistors TP10 and TP20 are cross-coupled.

PMOS transistors TP30 and TP40 are connected in series between the high voltage source VBLH and the sense node CSN0. PMOS transistors TP50 and TP60 are connected in series between the high voltage source VBLH and the sense node BCSN0. Gates of the transistors TP30 and TP50 are connected to a signal line BCLOADON. Gates of the transistors TP40 and TP60 are connected in common to the sense node BCSN0. With this arrangement, the transistors TP30 and TP40 and the transistors TP50 and TP60 constitute a current mirror between the sense nodes CSN0, BCSN0 and the high voltage source VBLH.

The sense nodes CSN0 to CSN7 and BCSN0 to BCSN7 are connected to the data input and output lines CDQ0 to CDQ7 and BCDQ0 to BCDQ7 via NMOSs, respectively. These NMOSs are controlled by a counter column selection line CCSL.

Figure 7:
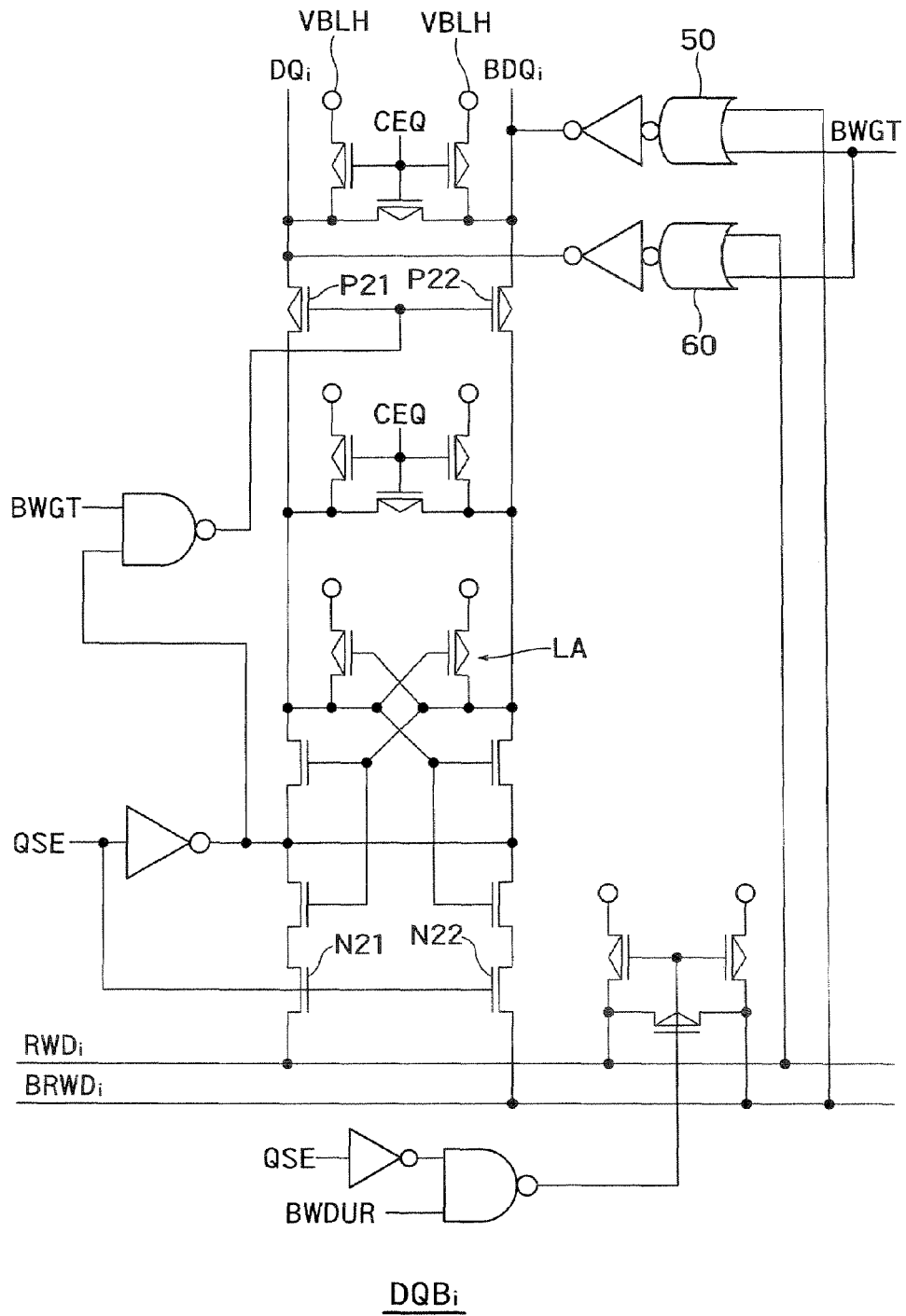
FIG. 7 is a circuit diagram showing details of a DQ buffer DQBi shown in FIG. 2.

FIG. 7 is a circuit diagram showing details of the DQ buffers DQBi (i=0 to 7) shown in FIG. 2. When the DQ buffer DQBi reads data DQi and BDQi from the data sense amplifier DSA, a column equalize signal CEQ is set to HIGH. Accordingly, the DQ buffer DQBi is disconnected from the high voltage source BVLH, and a voltage following the data DQi and BDQi is transmitted. In this case, a signal BWGT is HIGH, and a signal QSE is HIGH. Therefore, PMOS transistors P21 and P22 are in the off state. As a result, the data DQi and BDQi are stored in a latch unit LA, and are amplified. In this case, NMOS transistors N21 or N22 are in the on state. Therefore, the data DQi and BDQi that are amplified in the latch unit LA are read out to read/write drive lines RWDi and BRWDi.

When the DQ buffer DQBi outputs the write data DQi and BDQi to the data sense amplifier DSA, the signal BWGT is set to LOW. Accordingly, NOR gates 50 and 60 output signals corresponding to signal levels of the read/write drive lines RWDi and BRWDi, respectively. As a result, the DQ buffer DQBi can output the data DQi and BDQi to the data sense amplifier DSA.

Figure 8:
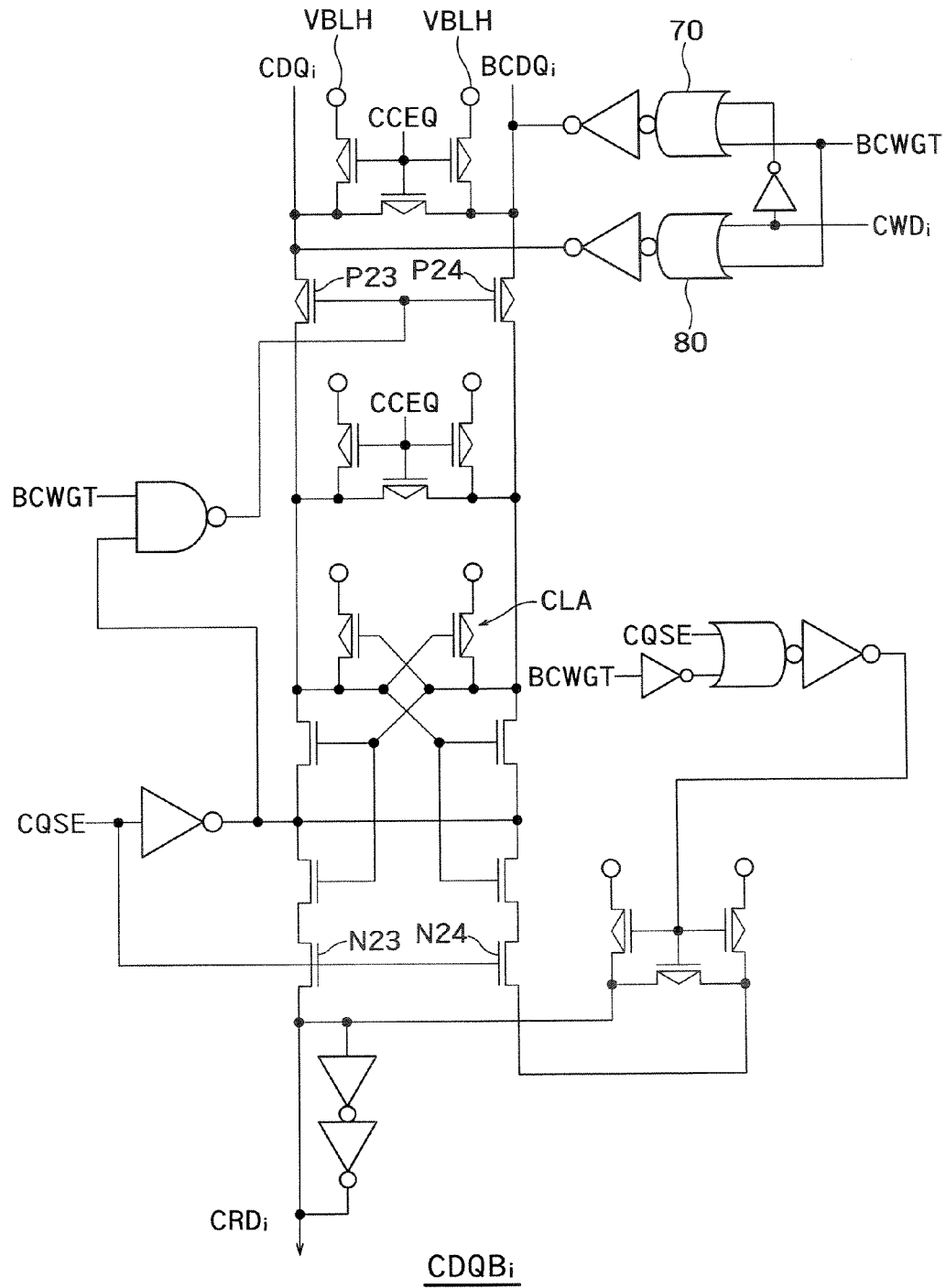
FIG. 8 is a circuit diagram showing details of a counter DQ buffer CDQBi shown in FIG. 2.

FIG. 8 is a circuit diagram showing details of the counter DQ buffers CDQBi (i=0 to 7) shown in FIG. 2. When the counter DQ buffer CDQBi reads data CDQi and BCDQi of the number of times of activation from the counter sense amplifier CSA, a counter column equalize signal CCEQ is set to HIGH. Accordingly, the counter DQ buffer CDQBi is disconnected from the high voltage source BVLH, and a voltage following the data CDQi and BCDQi is transmitted. In this case, a signal BCWGT is HIGH, and a signal CQSE is HIGH. Therefore, PMOS transistors P23 and P24 are in the off state. As a result, the data CDQi and BCDQi are stored in a latch unit CLA, and are amplified. NMOS transistors N23 or N24 are on. Therefore, the data CDQi that is amplified in the latch unit CLA is output to the half adder HAi and the AND gate 10 as counter read data CRDi (see FIG. 2).

On the other hand, a sum S of the half adder HAi is sent to the counter DQ buffer CDQBi as counter write data CWDi. In this case, the signal BCWGT is set to LOW. Accordingly, the NOR gates 70 and 80 output signals corresponding to the counter write data CWDi. As a result, the DQ buffer DQBi can output the counter data CDQi and BCDQi to the data sense amplifier DSA.

Figure 9:
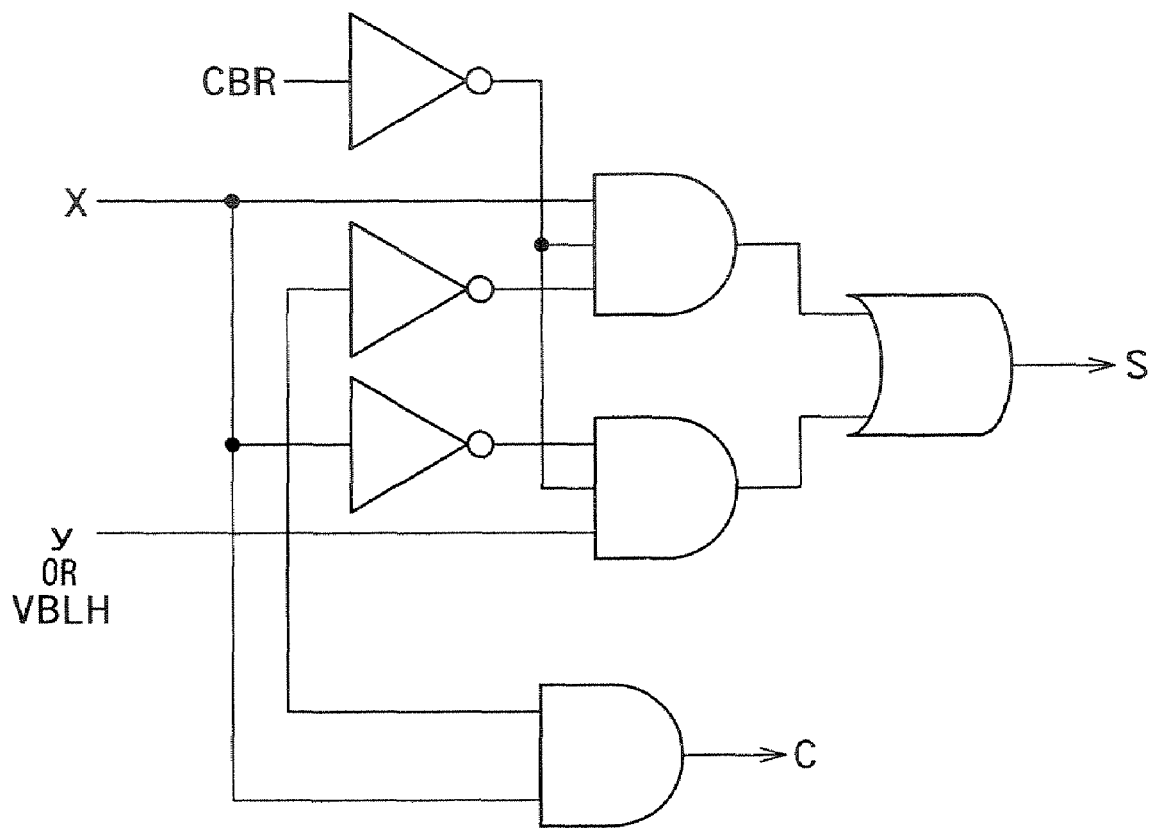
FIG. 9 is a circuit diagram showing the inside of an half adder HAi.

FIG. 9 is a circuit diagram showing the inside of the half adder HAi. During the normal refresh operation, the CAS-before-RAS signal CBR becomes HIGH, and therefore, the sum S becomes LOW. In other words, the half adder HAi outputs "00000000".

On the other hand, during the read/write operation, the signal CBR is LOW. Therefore, the sum S is output based on inputs x and y. The high voltage source VBLH is connected to the input y of the half adder HA0 corresponding to a least significant bit. Accordingly, during the read/write operation, the half adder HAi (i=0 to 7) returns the counter write data CWDi, which is obtained by incrementing by one the counter read data CRDi input from the input x, to the counter DQ buffer CDQBi.

Figure 10:
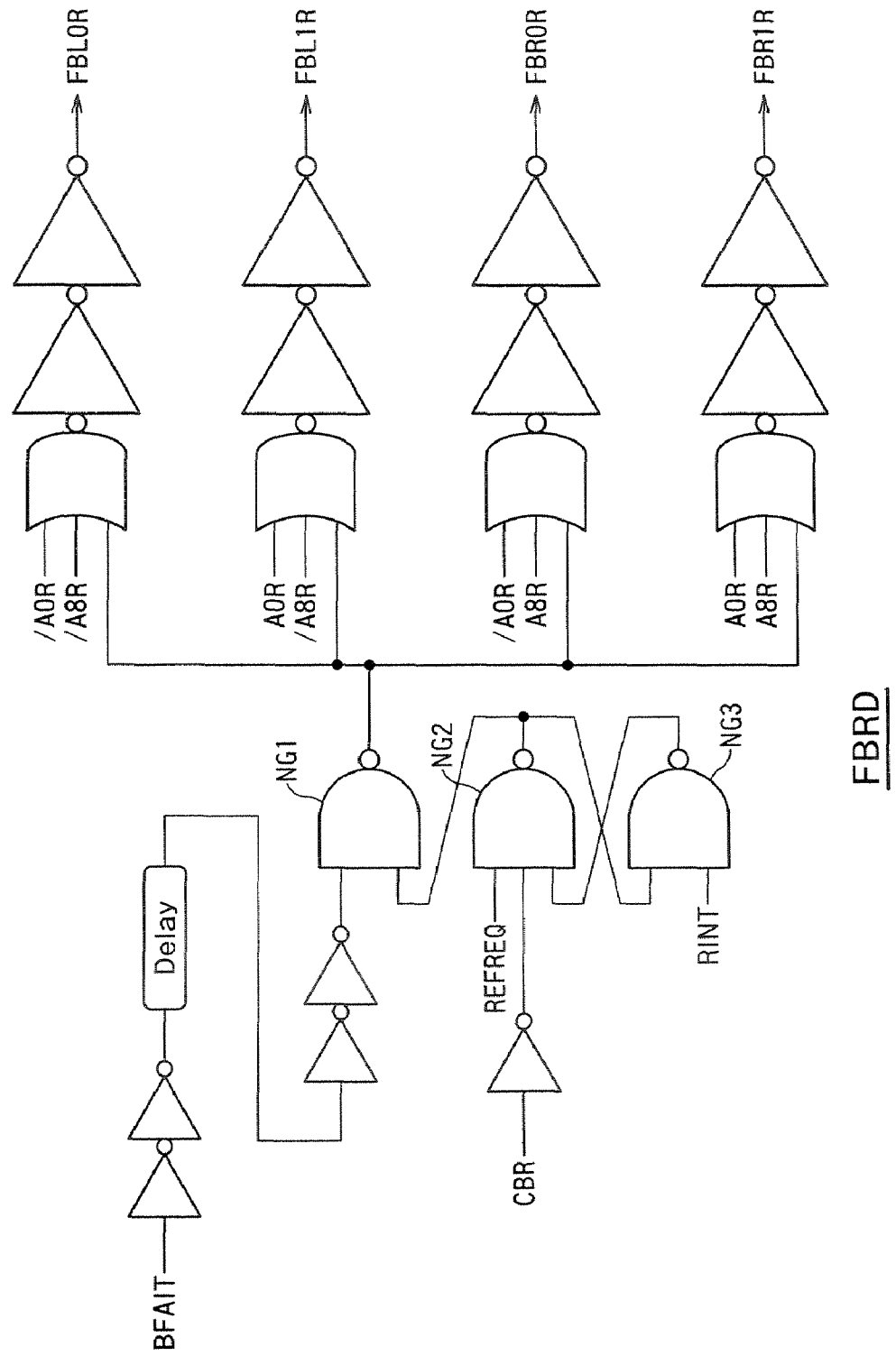
FIG. 10 is a circuit diagram showing a configuration of a row feedback signal drive circuit FBRD.

FIG. 10 is a circuit diagram showing a configuration of the row feedback signal drive circuit FBRD. The row feedback signal drive circuit FBRD receives the signals REFREQ, CBR, RINT, and BFAIT, and address signals /A0R, A8R, A0R, and A8R, and outputs signals FBL0R, FBL1R, FBR0R, and FBR1R. The signals FBL0R, FBL1R, FBR0R, and FBR1R are used to control NOR gates GL0, GL1, GR0, and GR1.

The signal BFAIT falls to LOW at timing when both signals φTR and φTL become LOW. A delay circuit DELAY gives a delay from when the counter DQ buffer CDQB operates based on the activation of the signal CQSE till when the signal REFREQ falls, to the signal BFAIT (see FIG. 17). Accordingly, at the request of the ad hoc refresh operation, a row feedback signal can be driven securely.

The address signals /A0R and A0R are least significant bits of a row address signal, respectively, and are complementary signals each other. The address signals /A0R and A0R determine a selection of word lines WLLj whose j are odd numbers or whose j are even numbers, respectively. A memory cell MC that is connected to a word line whose j is an odd number is connected to a bit line BBLLk. A memory cell MC that is connected to a word line whose j is an even number is connected to a bit line BLLk. In other words, the address signals /A0R and A0R can be referred to as addresses that specify the bit line BBLLk or the bit line BLLk.

The address signals /A8R and A8R are addresses that specify any one of left and right memory cell arrays MCAs of the sense amplifier SA.

NAND gates NG2 and NG3 constitute a latch circuit. During the read/write operation having no ad hoc refresh (FIG. 14 and FIG. 15), the signal CBR is LOW, and the signal REFREQ is HIGH. Therefore, the NAND gate NG2 outputs LOW, and the NAND gate NG3 outputs HIGH. During the write operation, the signal BFAIT is HIGH, and the NAND gate NG2 is LOW. Therefore, the NAND gate NG1 outputs HIGH. Accordingly, the row feedback circuit FBRD outputs LOW for the signals FBL0R, FBL1R, FBR0R, and FBR1R, regardless of the address signals /A0R, A8R, A0R, and A8R.

During the read/write operation having ad hoc refresh (FIG. 16 and FIG. 17), the signal REFREQ is activated to LOW, and the NAND gate NG1 outputs LOW. Accordingly, the row feedback circuit FBRD outputs the signals FBL0R, FBL1R, FBR0R, and FBR1R, following the address signals /A0R, A8R, A0R, and A8R.

Figure 11:
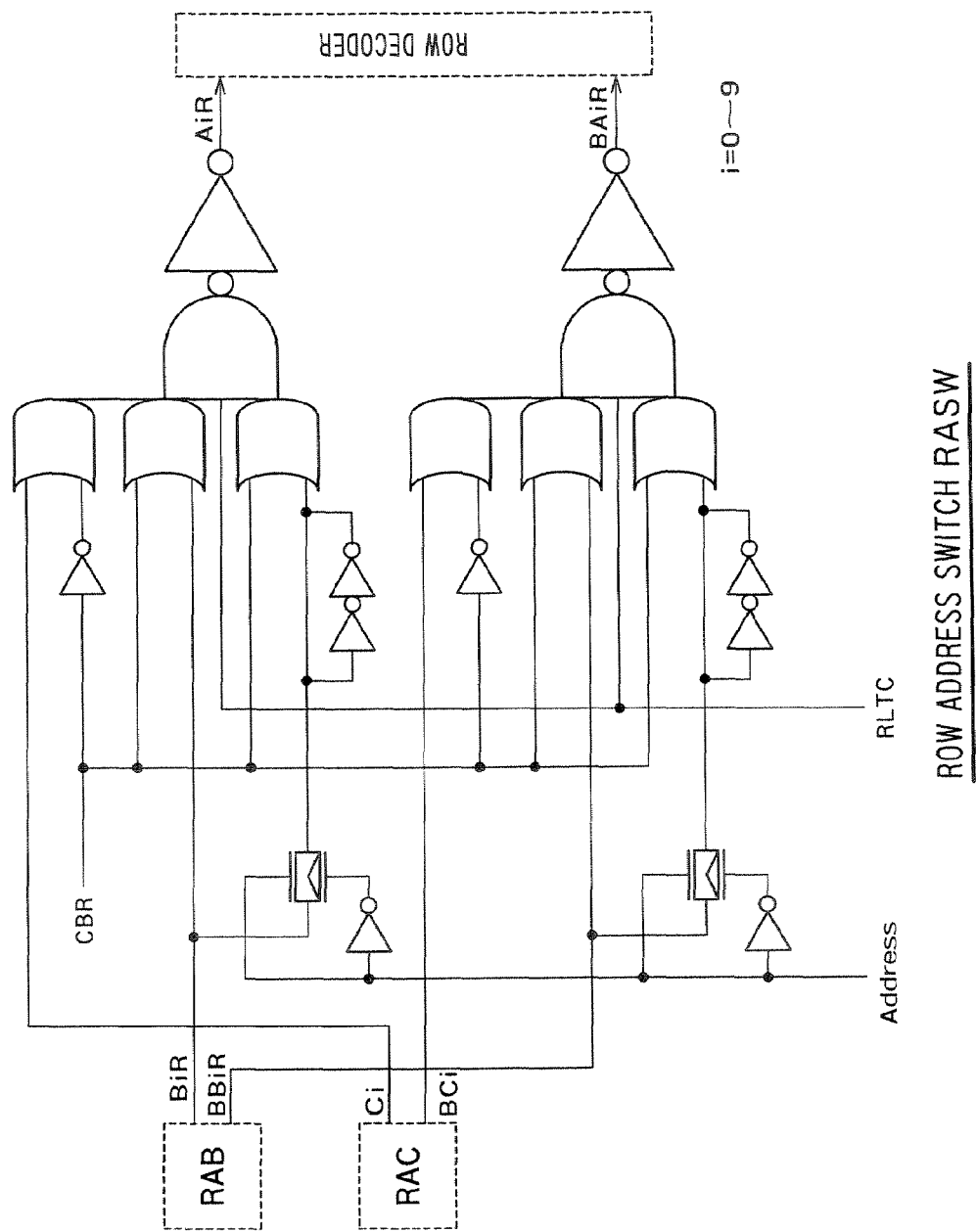
FIG. 11 is a circuit diagram showing a configuration of a row address switch RASW.

FIG. 11 is a circuit diagram showing a configuration of the row address switch RASW. The row address switch RASW receives address signals BiR and BBiR from the row address buffer RAB, and inputs address signals Ci and BCi from the row address counter RAC.

During the normal refresh operation, a signal CBR rises, and the address signals Ci and BCi are transmitted to the row decoder as address signals AiR and BAiR. In this case, all memory cells MCs that are connected to the word line selected by the row address counter RAC are refreshed (Normal Refresh Operation)

Figure 12:
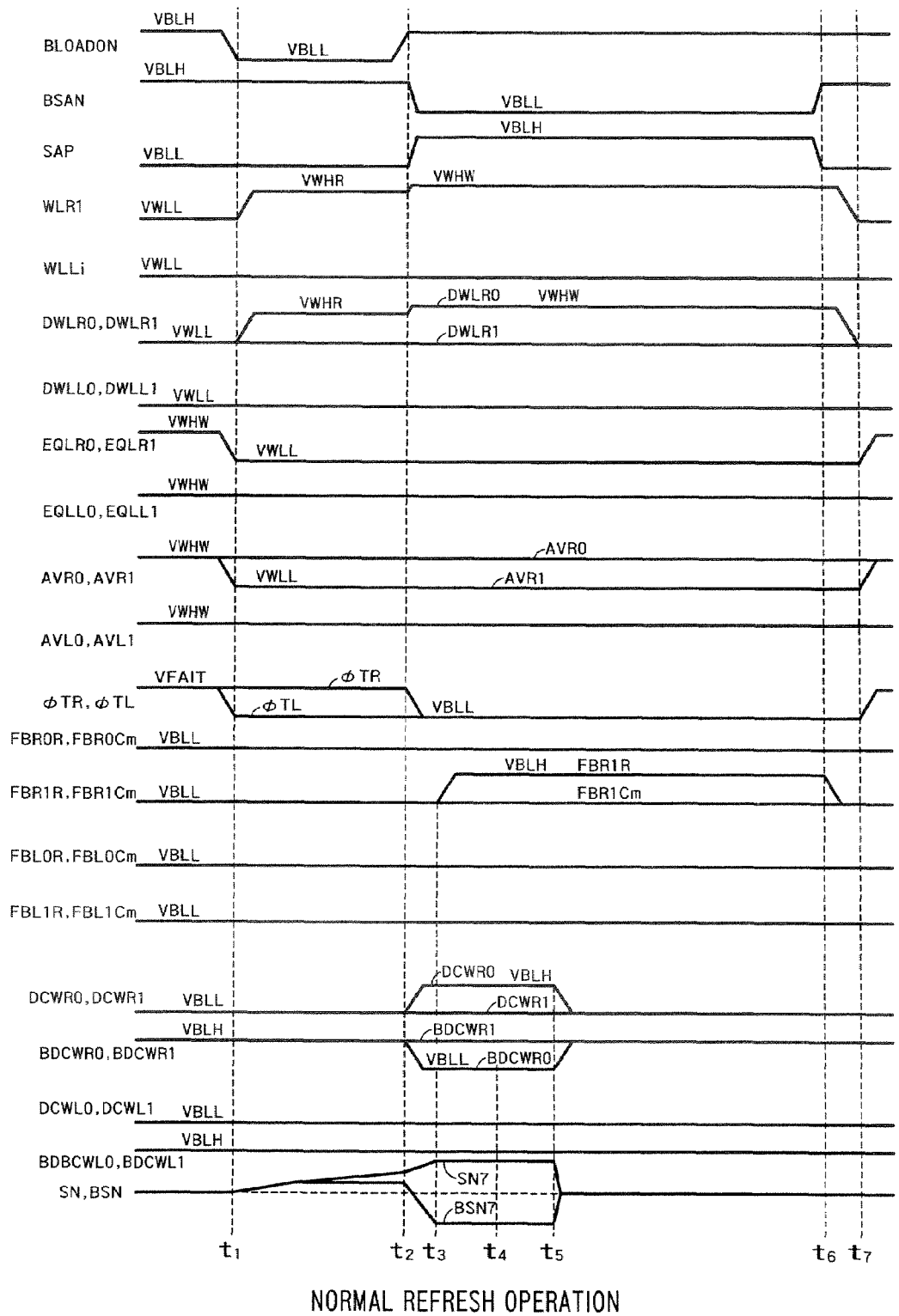
FIG. 12 is a timing diagram of a semiconductor memory device 100 in a normal refresh operation.
Figure 13:
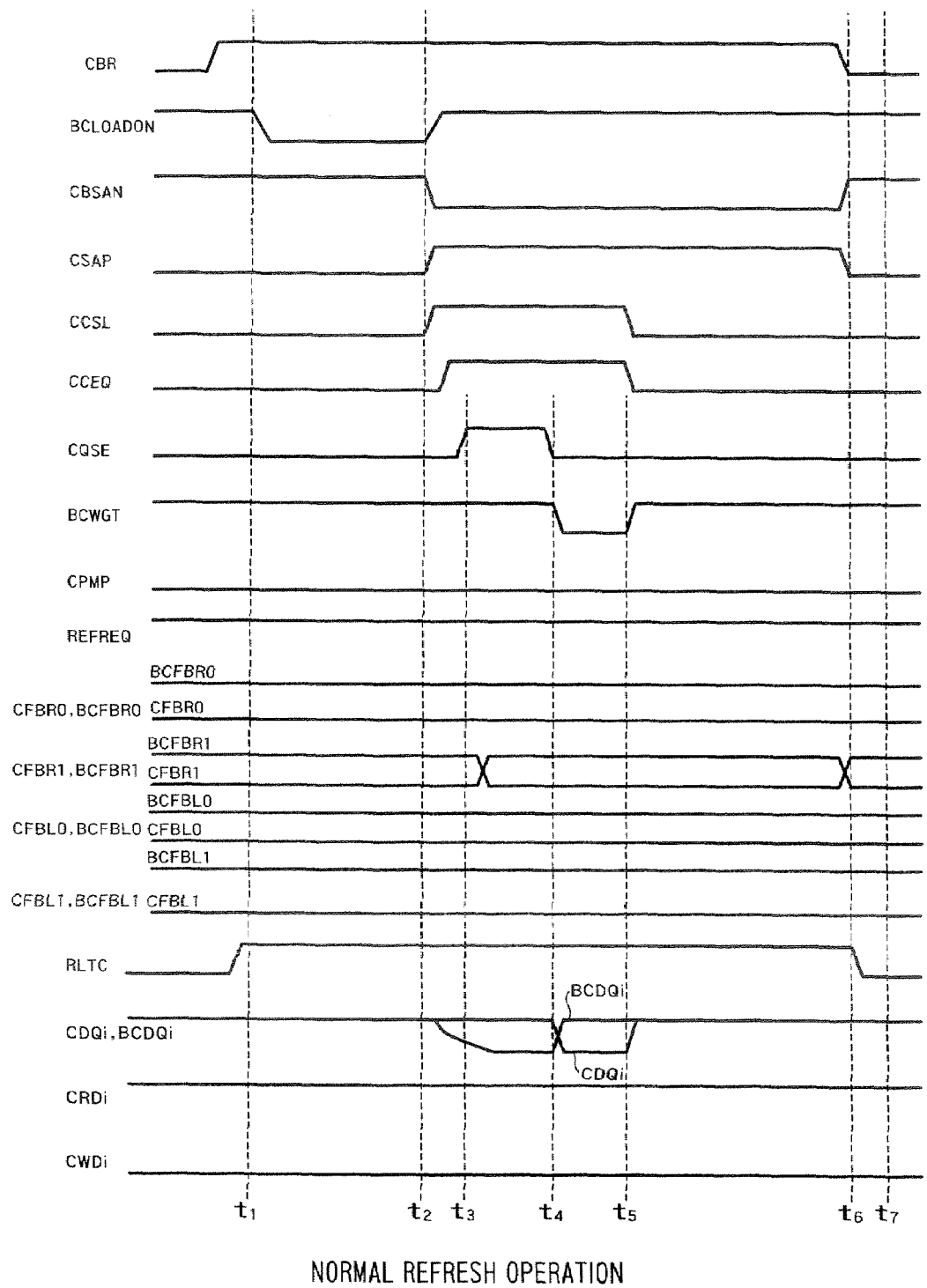
FIG. 13 is a timing diagram of the semiconductor memory device 100 in the normal refresh operation.

FIG. 12 and FIG. 13 are timing diagrams of the semiconductor memory device 100 in the normal refresh operation. FIG. 12 is a timing diagram of signals concerning the data sense amplifier DSA, and FIG. 13 is a timing diagram of signals concerning the counter sense amplifier CSA.

The normal refresh operation is started when the CAS-before-RAS signal CBR (FIG. 13) as a standard specification of a DRAM rises to HIGH. The signal CBR is activated when the signal /CAS falls to LOW before the signal /RAS falls to LOW. The signal CBR is not activated by the normal read/ write operation and the ad hoc refresh operation. Based on this signal CBR, the semiconductor memory device 100 refreshes all memory cells connected to the word line corresponding to the address of the row address counter.

In the normal refresh operation, all word lines are selected in a fair order, regardless of the number of times of activating a word line. This point is different from the ad hoc refresh operation. In the refresh operation, data stored in the memory cell MC is once read out, this data is latched, and then the same data is written into the same memory cell MC again.

Specifically, during a period from t1 to t2, data is read from the memory cell MC. At t1, the signal BLOADON is activated to LOW. At the same time, a word line is selected following a row address. In FIG. 12, a word line WLR1 is selected. Accordingly, data in all memory cells MCs that are connected to the word line WLR1 are transmitted to a sense node BSN via a bit line BBLRk. In the active state, a non-inverted signal (i.e., a signal having no B or/(bar) at the head of a reference symbol) is HIGH, and an inverted signal (i.e., a signal having B or/(bar) at the head of a reference symbol) is LOW. In the inactive state, a signal level is opposite to that in the active state.

In the sense node BSN, data of the memory cell MC is developed. In the sense node SN, a reference potential is developed. After data is sufficiently transmitted to the sense node SN, the bit line and the sense nodes SN and BSN are disconnected at t2, and the signals SAP and BSAN are activated. Accordingly, data of the sense nodes SN and BSN are amplified. The amplified data are held by the latch circuit constituted by the transistors TN1 and TN2 and the latch circuit constituted by the transistors TP1 and TP2 shown in FIG. 4.

In the read operation during a period from t1 to t3, signals FBL0R, FBL1R, FBR0R, FBR1R, FBL0Cm, FBL1Cm, FBR0Cm, and FBR1Cm (m=0 to 127) are all LOW. Therefore, the transfer gates CTGL0, CTGL1, CTGR0, and CTGR1 are all in the off state.

In the rewrite operation during a period from t3 to t5, the data held in the latch circuit is written into all memory cells MCs connected to a selected word line. For example, when the signal FBR1R extending in a row direction is activated to HIGH, all NOR gates GR1 connected to the signal FBR1R output LOW. Accordingly, the transfer gates CTGR1 within all data sense amplifiers DSAs become on. In this case, data latched in the sense node SN is transmitted to the memory cell MC connected to the bit line BBLR, and is written into all memory cells MCs connected to the selected word line.

In the counter sense amplifier CSA, the counter column selection line CCSL rises, and the data of the counter cell CC is read out based on the signals CCEQ, CQSE, and BCWGT, as shown in FIG. 13. Data obtained by incrementing this data is written back into the counter cell CC. In this case, the signal CBR is HIGH. Therefore, when the counter cell CC stores 8-bit data, the half adder HAi outputs "00000000" regardless of the data that is read from the counter cell CC, as explained with reference to FIG. 9.

In this case, the signal CFBR1 is activated to HIGH. As a result, the NOR gate CGR1 shown in FIG. 5 outputs LOW, and the transfer gate CCTGR1 becomes on. At this time, the data "00000000" is transmitted to the counter memory cell CC that is connected to the bit line BCLR, and is written into all counter cells CCs connected to the selected word line. In other words, all data in the counter cells CCs connected to the selected word line WLj are initialized to zero. The zero (0) means a logical value in the DQ line. Therefore, while "1" is written into the counter cell CC connected to the BCLLi or BCLRi during the data reading operation, "0" is written into cells connected to CLLi or CLRi during the data reading operation.

(Read/Write Operation, without Ad Hoc Refresh Operation)

Figure 14:
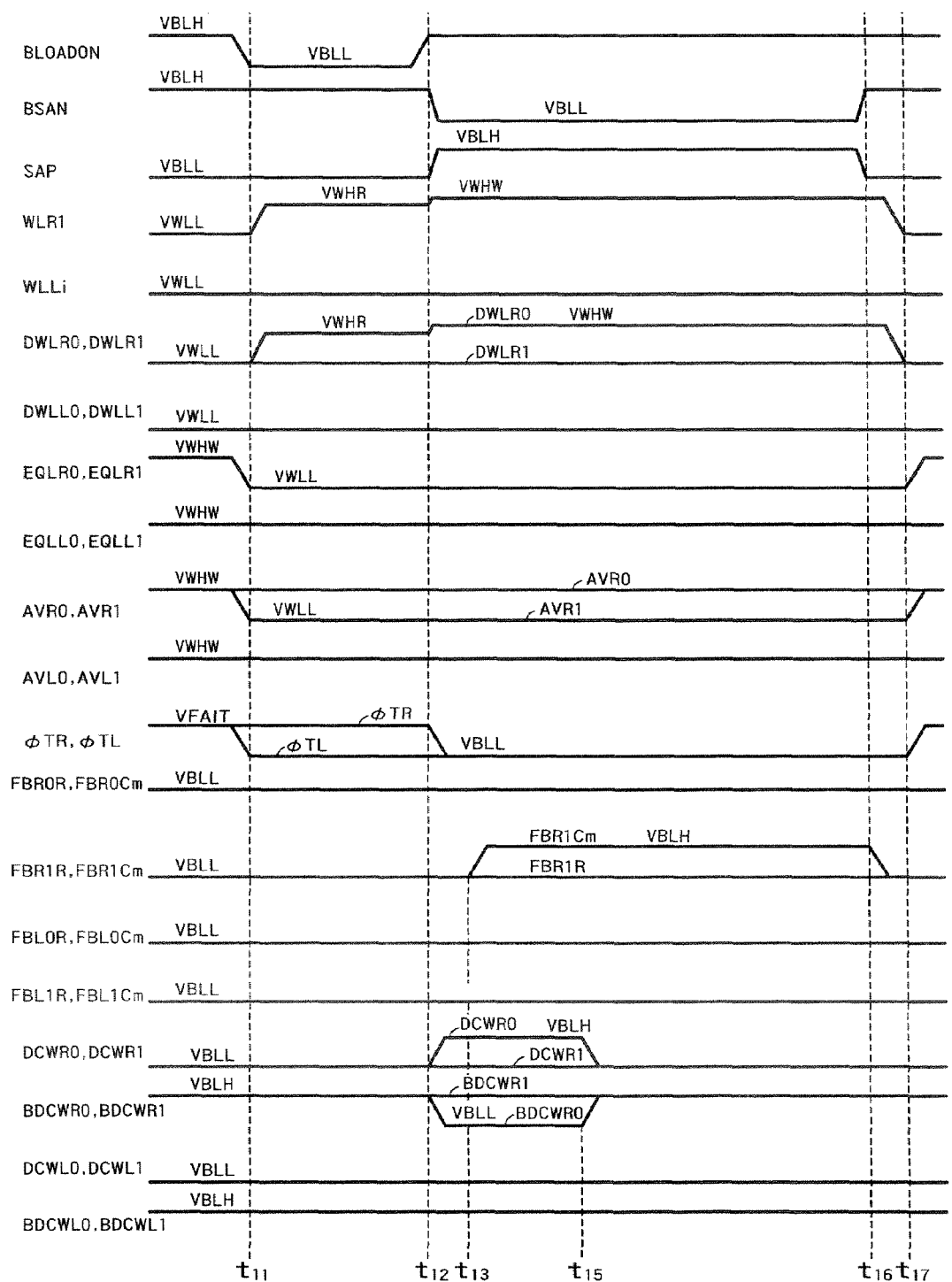
FIG. 14 is a timing diagram of an FBC memory 100 in a read/write operation when the number of times of activation has not reached a predetermined value.
Figure 15:
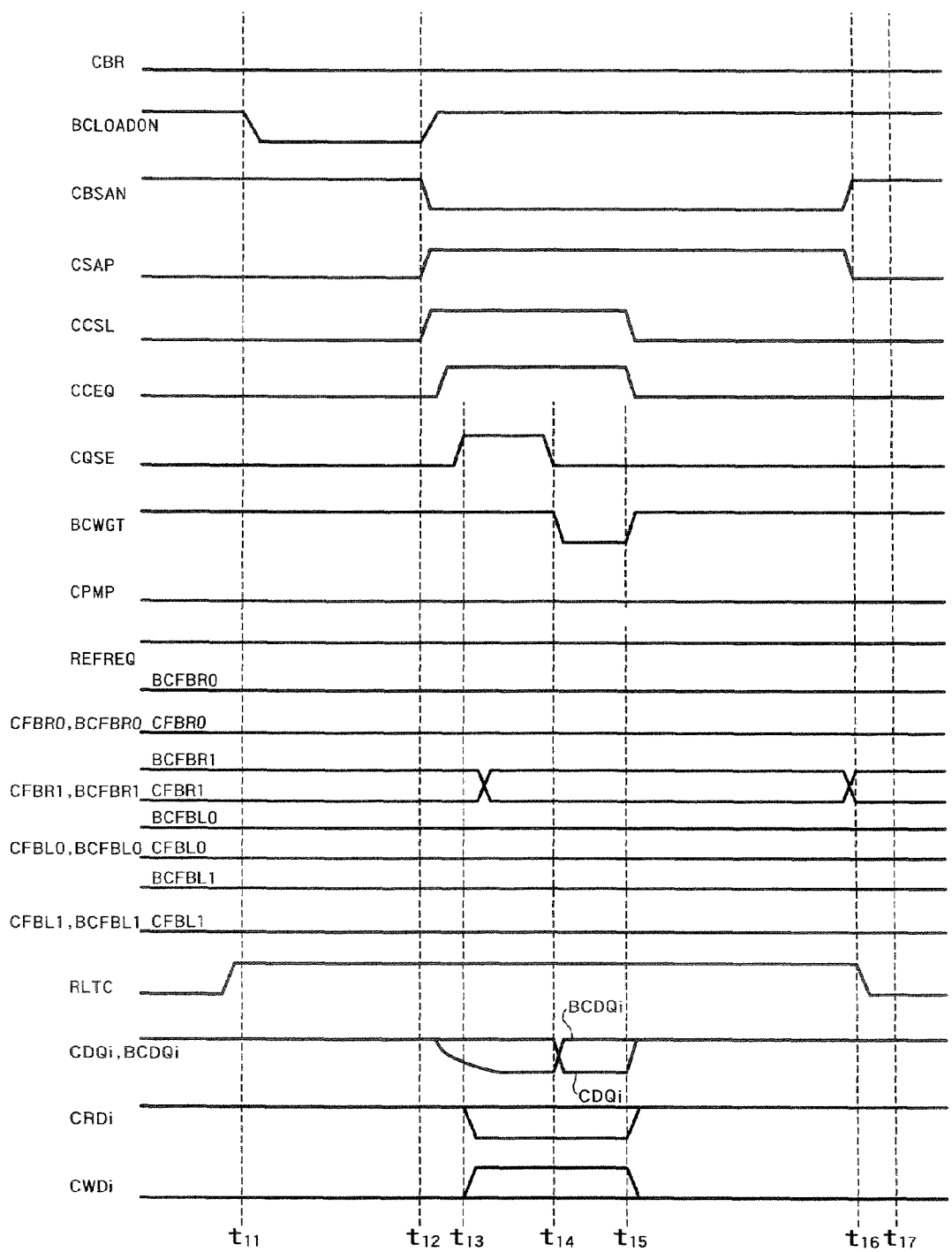
FIG. 15 is a timing diagram of the FBC memory 100 in the read/write operation when the number of times of activation has not reached a predetermined value.

FIG. 14 and FIG. 15 are timing diagrams of the FBC memory 100 in the read/write operation when the number of times of activation has not reached a predetermined value. FIG. 14 is a timing diagram of signals concerning the data sense amplifier DSA, and FIG. 15 is a timing diagram of signals concerning the counter sense amplifier CSA. Operations of the sense nodes SN, BSN, CSN, and BCSN are similar to the operations explained with reference to FIG. 12 and FIG. 13, and therefore, these operations are not explained with reference to FIG. 14 and FIG. 15.

In the read/write operation, the CAS-before-RAS signal CBR maintains LOW.

In the read operation during a period from t11 to t13, the signals FBR0R, FBR1R, FBL0R, FBL1R, FBR0Cm, FBR1Cm, FBL0Cm, and FBL1Cm are all LOW. Therefore, the transfer gates CTGL0, CTGL1, CTGR0, and CTGR1 are all in the off state.

In the write operation during a period from t13 to t15, the data held in the latch circuit is written into only the memory cells MCs connected to a selected bit line. For example, the signals FBR1Ck (k=any one of 0 to 127) that extend in a column direction is activated to HIGH. In this case, the NOR gates GR1 connected to the signal FBR1Ck output LOW. Accordingly, the transfer gates CTGR1 connected to the NOR gates GR1 become on. As a result, data can be stored in only selected memory cells MCs corresponding to the selected bit line BLk. Data is not written into unselected memory cells. There are only eight selected memory cells in 1,024 memory cells that are connected to the selected word line. All the rest of the memory cells are unselected memory cells. Therefore, when data is not written into the unselected memory cells, total power consumption of the device can be substantially suppressed.

In the counter sense amplifier CSA, data of the counter cells CCs connected to the selected word line WL are read out. For example, when eight counter cells CCs are connected to the selected word line WL, 8-bit data are read out. The data are latched by the counter DQ buffers CDQB0 to CDQB7 shown in FIG. 2 or FIG. 10. The data are also output to the half adders HA0 to HA7, and are output to the AND gate 10. The half adders HA0 to HA7 increment the data (for example, add one to the 8-bit data). The half adders HA0 to HA7 return the incremented data to the counter DQ buffers CDQB0 to CDQB7. The AND gate 10 outputs a logical product of the bits of the data as a signal CPMP.

In this example, the outputs of the counter DQ buffers CDQB0 to CDQB7 do not reach a predetermined value. Therefore, the signals CPMP and REFREQ are not activated, and the ad hoc refresh operation is not executed in this read/write cycle. The data within the counter DQ buffers CDQB0 to CDQB7 are written back straight into the counter cells CCs.

(Read/Write Operation, with Ad Hoc Refresh Operation)

Figure 16:
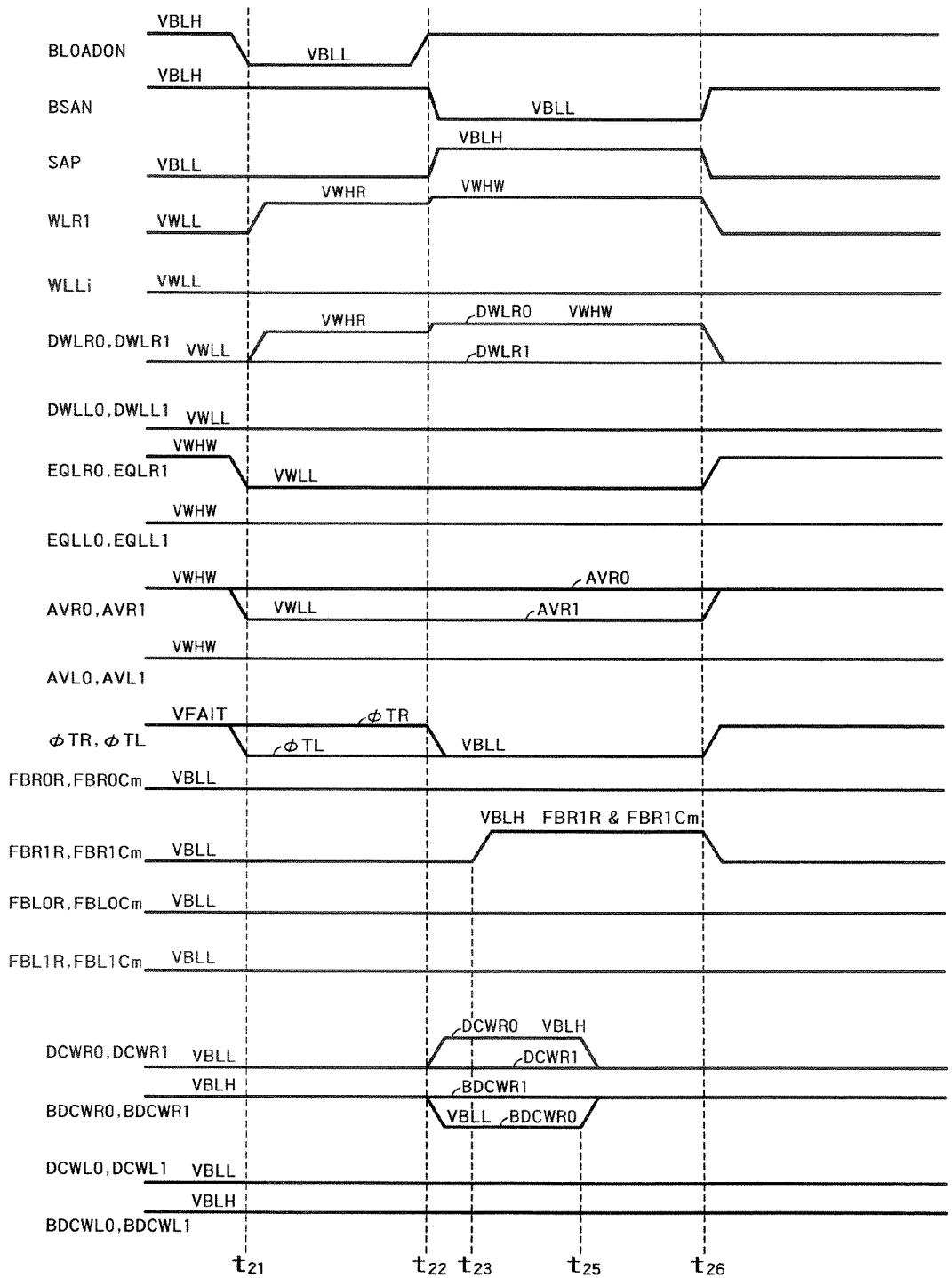
FIG. 16 is a timing diagram of the FBC memory 100 in a read/write operation when the number of times of activation has reached a predetermined value.
Figure 17:
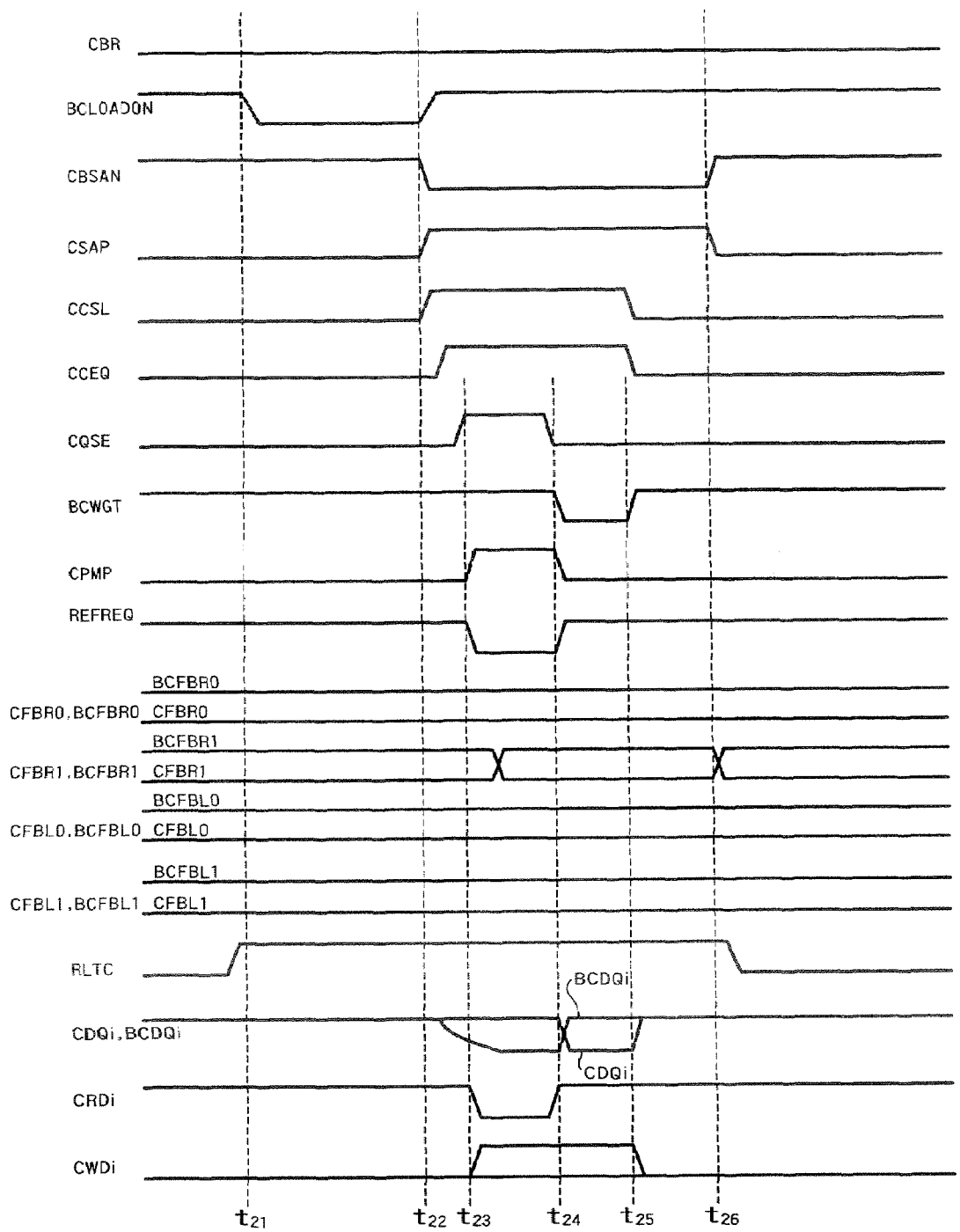
FIG. 17 is a timing diagram of the FBC memory 100 in the read/write operation when the number of times of activation has reached a predetermined value.

FIG. 16 and FIG. 17 are timing diagrams of the FBC memory 100 in the read/write operation when the number of times of activation has reached a predetermined value. FIG. 16 is a timing diagram of signals concerning the data sense amplifier DSA, and FIG. 17 is a timing diagram of signals concerning the counter sense amplifier CSA. Operations of the sense nodes SN, BSN, CSN, and BCSN are similar to the operations explained with reference to FIG. 12 and FIG. 13, and therefore, these operations are not explained with reference to FIG. 16 and FIG. 17.

In the read/write operation, the CAS-before-RAS signal CBR maintains LOW.

In the read operation during a period from t21 to t23, the signals FBR0R, FBR1R, FBL0R, FBL1R, FBR0Cm, FBR1Cm, FBL0Cm, and FBL1Cm are all LOW. Therefore, the transfer gates CTGL0, CTGL1, CTGR0, and CTGR1 are all in the off state.

In the counter sense amplifier CSA, data of the counter cells CCs connected to the selected word line WL are read out. The data are also output to the half adders HA0 to HA7, and are output to the AND gate 10. When the read data reaches a predetermined value, the AND gate 10 activates the signal CPMP. For example, when 8-bit data from eight counter cells CCs is "11111111", the AND gate 10 sets the signal CPMP to HIGH. The signal CPMP is activated, and the signal REFREQ is activated to LOW. Accordingly, the ad hoc refresh operation is executed at the same timing as that of the write cycle in the data read/write cycle. The half adders HA0 to HA7 increment the data, and return the "00000000" to the counter DQ buffers CDQB0 to CDQB7. As a result, the number of times of activating the selected word line can be returned to the initial value.

Since the signal REFREQ is active, not only one signal FBR1Ck that extends in a column direction but also the signal FBR1R that extends in a row direction is also activated to HIGH, in the write operation during a period from t23 to t25. Therefore, the data held in the latch circuit is written into all memory cells MCs that are connected to the selected word line. Accordingly, the data in the selected memory cell is updated, and the unselected memory cells are refreshed. As a result, a charge pumping phenomenon can be prevented.

In this embodiment, the ad hoc refresh operation is executed within the read/write cycle when the number of times of activating the word line reaches a predetermined value. Accordingly, the ad hoc refresh operation does not extend the read/write cycle period and the precharge period. In other words, the period of the read/write cycle becomes constant regardless of presence or absence of the ad hoc refresh operation.

(1) When the number of times of activation reaches a predetermined value, instead of executing the ad hoc refresh operation in the read/write cycle, the ad hoc refresh operation can be executed in the next or subsequent cycles. However, in this case, a memory circuit that stores the address of the word line which requires the ad hoc refresh and a comparator circuit that compares the address of the word line which requires the ad hoc refresh with the address of the selected word line in the next and the subsequent cycles are necessary.

When all selected word lines exceed a predetermined value between a certain normal refresh operation and the next normal refresh operation, an enormous number of memory circuits and comparator circuits are necessary. This results in a very large chip size and high cost.

(2) When the number of times of activation reaches a predetermined value, the ad hoc refresh operation can be executed during the precharge operation after ending this cycle. However, in this case, it is necessary to start the word line again, read data, and rewrite the data. This increases the precharge period.

For example, assume that one cycle period is expressed as tRC, an active period (read/write period) is expressed as tRAS, a precharge period is expressed as tRP, and a transient time between active and precharge is expressed as tT. Then, tRC is expressed as tRC=tRAS+tRP+2tT. When the precharge period tRP becomes long, the total cycle period tRC becomes long. Ordinarily, a user uses a memory by assuming that the ad hoc refresh operation is always executed during the active period. Therefore, the total operation of the memory becomes very slow.

On the other hand, in this embodiment, when the number of times of activation reaches a predetermined value, the ad hoc refresh is executed within this cycle. In other words, the ad hoc refresh operation is executed at the same time as that of the normal write operation and the write operation to the counter cell. Therefore, in this embodiment, high-speed ad hoc refresh operation becomes possible without requiring additional time. The user can use the memory at the same as that of the normal write operation without considering the number of times of activation. As explained above, since the user does not need to be conscious of the ad hoc refresh operation, the usability of the FBC memory 100 by the user is high according to this embodiment.

According to this embodiment, since the ad hoc refresh operation is not executed during the normal read/write operation, power consumption can be decreased. Further, when the number of times of activation reaches a predetermined value, the ad hoc refresh operation is carried out within this cycle. Therefore, a memory circuit and a comparator circuit are not necessary. As a result, the chip size becomes small.

Modification of the First Embodiment

Figure 18:
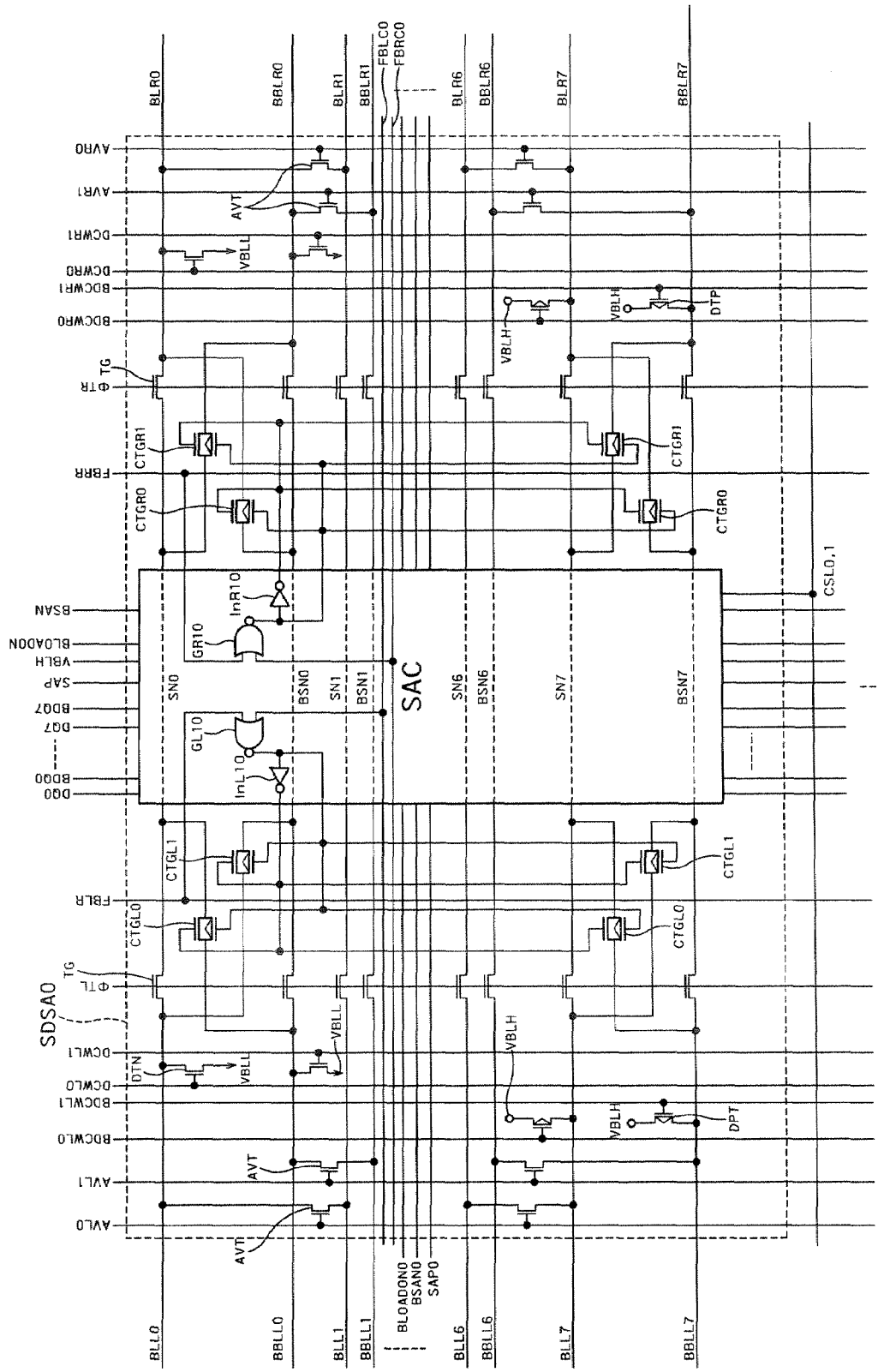
FIG. 18 is a circuit diagram showing a data sense amplifier according to a modification of the first embodiment.

FIG. 18 is a circuit diagram showing a data sense amplifier according to a modification of the first embodiment. The data sense amplifier DSA in the present modification has a smaller number of NOR gates and a smaller number of inverters than those of the data sense amplifier DSA shown in FIG. 3.

An NOR gate GL10 inputs a signal FBLC0 from a signal line that extends in a column direction, and inputs a signal FBLR from a signal line that extends in a row direction. The NOR gate GL10 outputs a result of an NOR operation of the signal FBLC0 and the signal FBLR to gates of transfer gates CTGL0 and CTGL1. The NOR gate GR10 receives a signal FBRC0 from a signal line that extends in a column direction, and inputs a signal FBRR from a signal line that extends in a row direction. The NOR gate GL10 outputs a result of an NOR operation of the signal FBRC0 and the signal FBRR to gates of transfer gates CTGR0 and CTGR1.

An inverter InL10 is connected to between an output of the NOR gate GL10 and NMOS gates of the transfer gates CTGL0 and CTGL1, respectively. An inverter InR10 is connected to between an output of the NOR gate GR10 and NMOS gates of the transfer gates CTGR0, CTGR1, respectively. Accordingly, the CMOS transfer gates CTGL0, CTGL1, CTGR0, and CTGR1 are controlled to either on or off. The NOR gates GL10 and GR10 and the inverters InL10 and InR10 connected to the outputs of these NOR gates respectively can be provided either in the inside or at the outside of the sense amplifier core SAC.

In the first embodiment, at the time of writing back data, the CMOS transfer gate connects only the data-side bit line for transmitting data to the sense node, without connecting the dummy-side bit line, which transmits the reference potential, to the sense node.

However, in this modification, the CMOS transfer gate connects not only the data-side bit line but also the dummy-side bit line to the sense node. When the data-side bit line and the dummy-side bit line are driven together as a bit line pair, the number of NOR gates and the number of inverters can be reduced. Accordingly, a circuit scale of the FBC memory can be made small. However, in this modification, writing into the dummy cell DC needs to be prohibited at the data write-back time. This can be achieved by inactivating the dummy word line.

Second Embodiment

Figure 19:
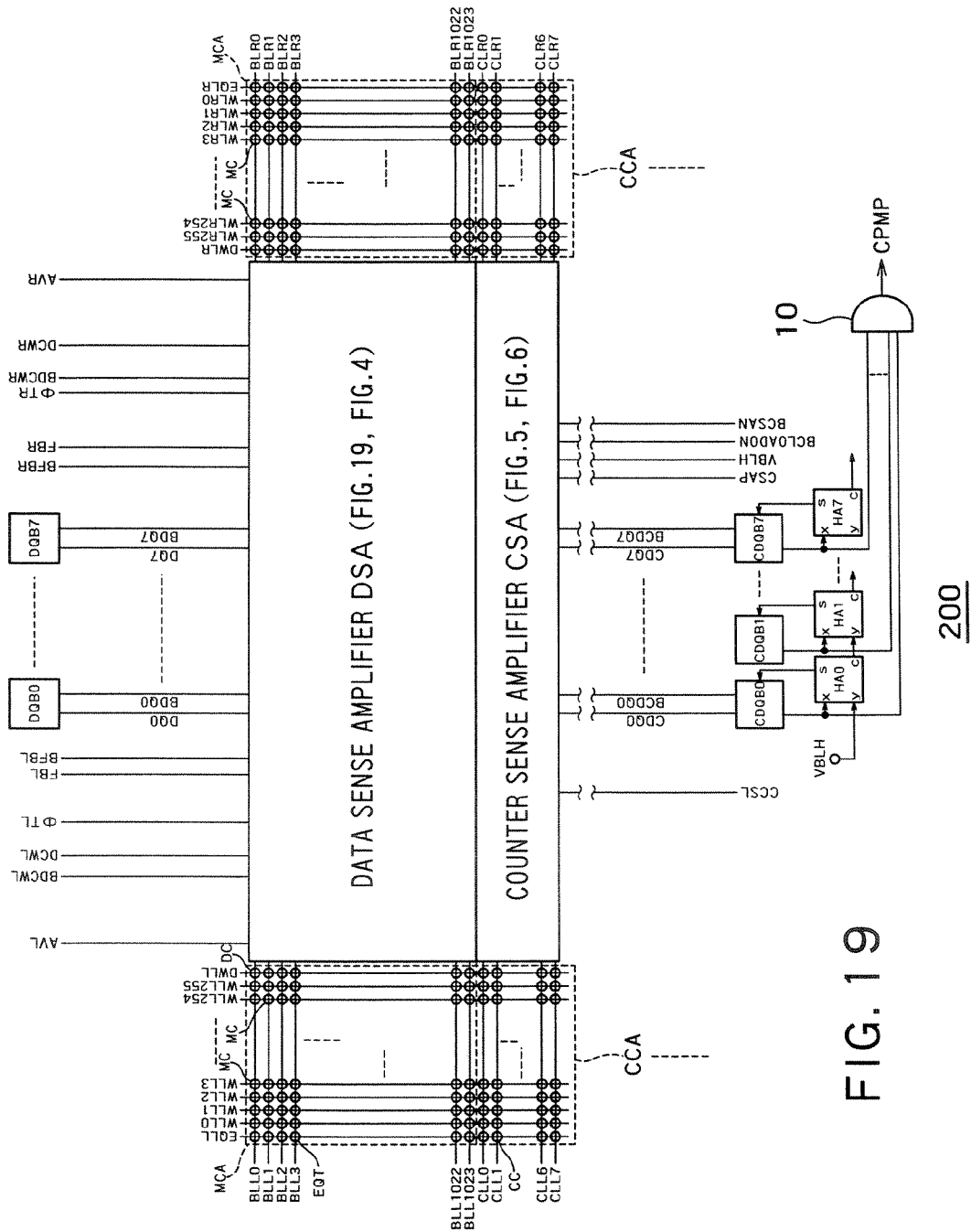
FIG. 19 is a circuit diagram of an FBC memory 200 according to a second embodiment of the present invention.
Figure 20:
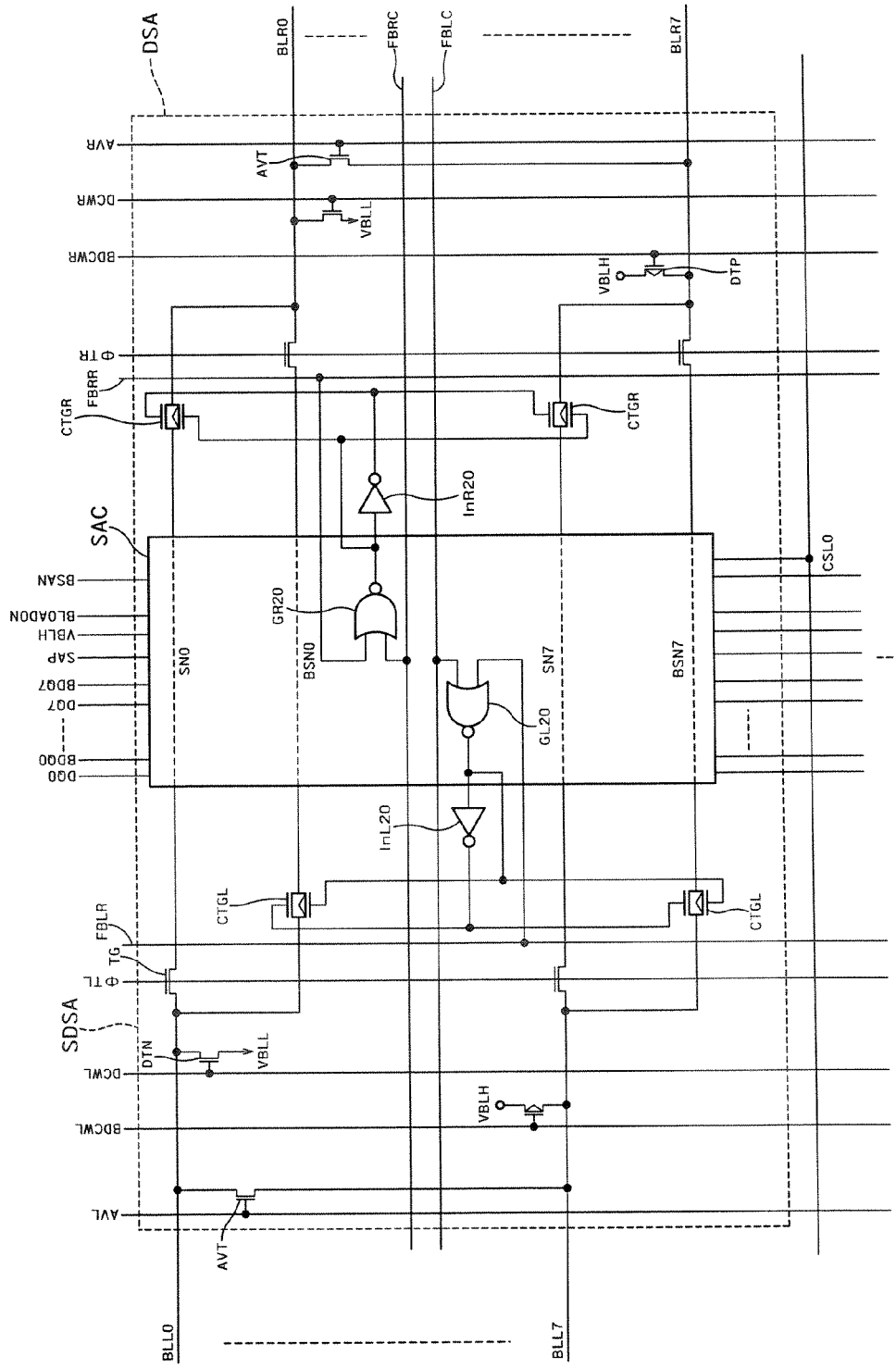
FIG. 20 is a circuit diagram of the FBC memory 200 according to the second embodiment.

FIG. 19 and FIG. 20 are circuit diagrams of an FBC memory 200 according to a second embodiment of the present invention. The FBC memory 200 is different from the FBC memory 100 in that the FBC memory 200 has an open-type bit line configuration. Therefore, a memory cell MC is provided at all intersections of word lines and bit lines. A counter cell CC is also provided at all intersections of word lines and counter bit lines. The bit lines BBLL0 to BBLL1023 are not provided.

FIG. 20 is a circuit diagram showing a configuration of the sense amplifier SA. There are signals FBLR and FBRR that extend to a row direction, and signals FBRC and FBLC that extend in a column direction. The signals FBLR and FBRR are used in common to plural sense amplifiers SAs. The signals FBRC and FBLC are used for each eight bit line pairs.

The sense amplifier SA also includes NOR gates GL20 and GR20. The NOR gate GL20 receives the signal FBLR and the signal FBLC, and outputs a result of an NOR operation of these signals to the transfer gate CTGL. An inverted output of the NOR gate GL20 is supplied to the PMOS of the transfer gate CTGL. A non-inverted output of the NOR gate GL20 is supplied to the NMOS of the transfer gate CTGL. The NOR gate GR20 inputs the signal FBRR and the signal FBRC, and outputs a result of an NOR operation of these signals to the transfer gate CTGR. A non-inverted output of the NOR gate GR20 is supplied to the PMOS of the transfer gate CTGR. An inverted output of the NOR gate GR20 is supplied to the NMOS of the transfer gate CTGR.

The sense amplifier core SAC is the same as that shown in FIG. 4, and therefore, is not explained herein. The configuration of the counter sense amplifier CSA is similar to that shown in FIG. 21 and FIG. 6, respectively, and the operation of the counter sense amplifier CSA is similar to that explained with reference to FIG. 13, FIG. 15, and FIG. 17.

Figure 21:
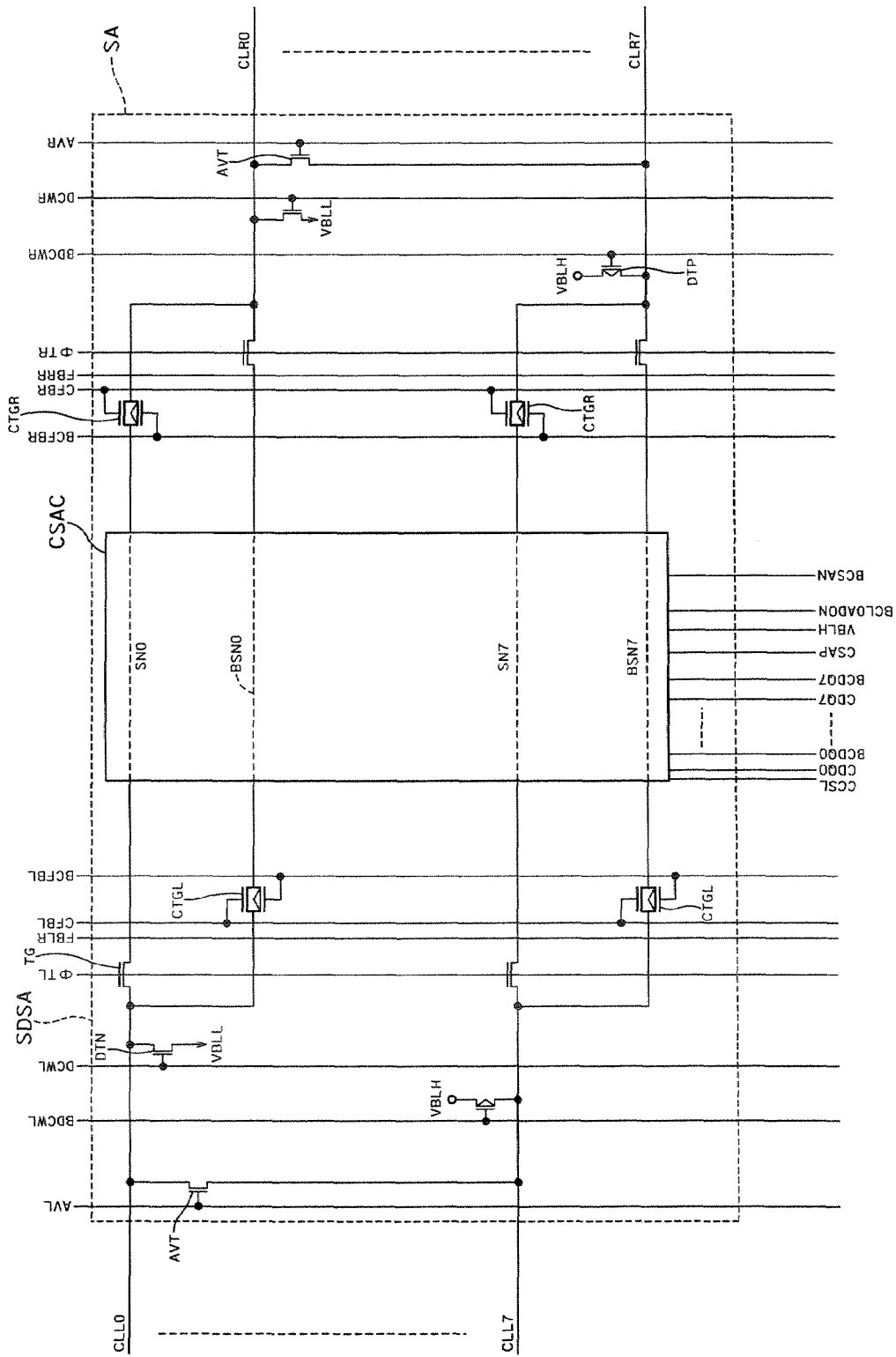
FIG. 21 is a circuit diagram showing a configuration of the counter sense amplifier CSA.

FIG. 21 is a circuit diagram of the configuration of the counter sense amplifier CSA. The counter sense amplifier CSA is different from the data sense amplifier DSA shown in FIG. 20 in that the counter sense amplifier CSA does not have the NOR gates GL20 and GR20, the inverters InL20 and InR20, and the signal lines FBRC and FBLC. The transfer gate CTG is controlled by the signals CFBL, BCFBL, CFBR, and BCFBR. The counter sense amplifier CSA is controlled by the exclusive drive signals BCSAN, CSAP, BCLOADON, CCSL, CDQ0 to CDQ7, and BCDQ0 to BCDQ7.

Other configurations of the counter sense amplifier CSA shown in FIG. 21 are similar to those of the data sense amplifier DSA shown in FIG. 20.

Figure 22:
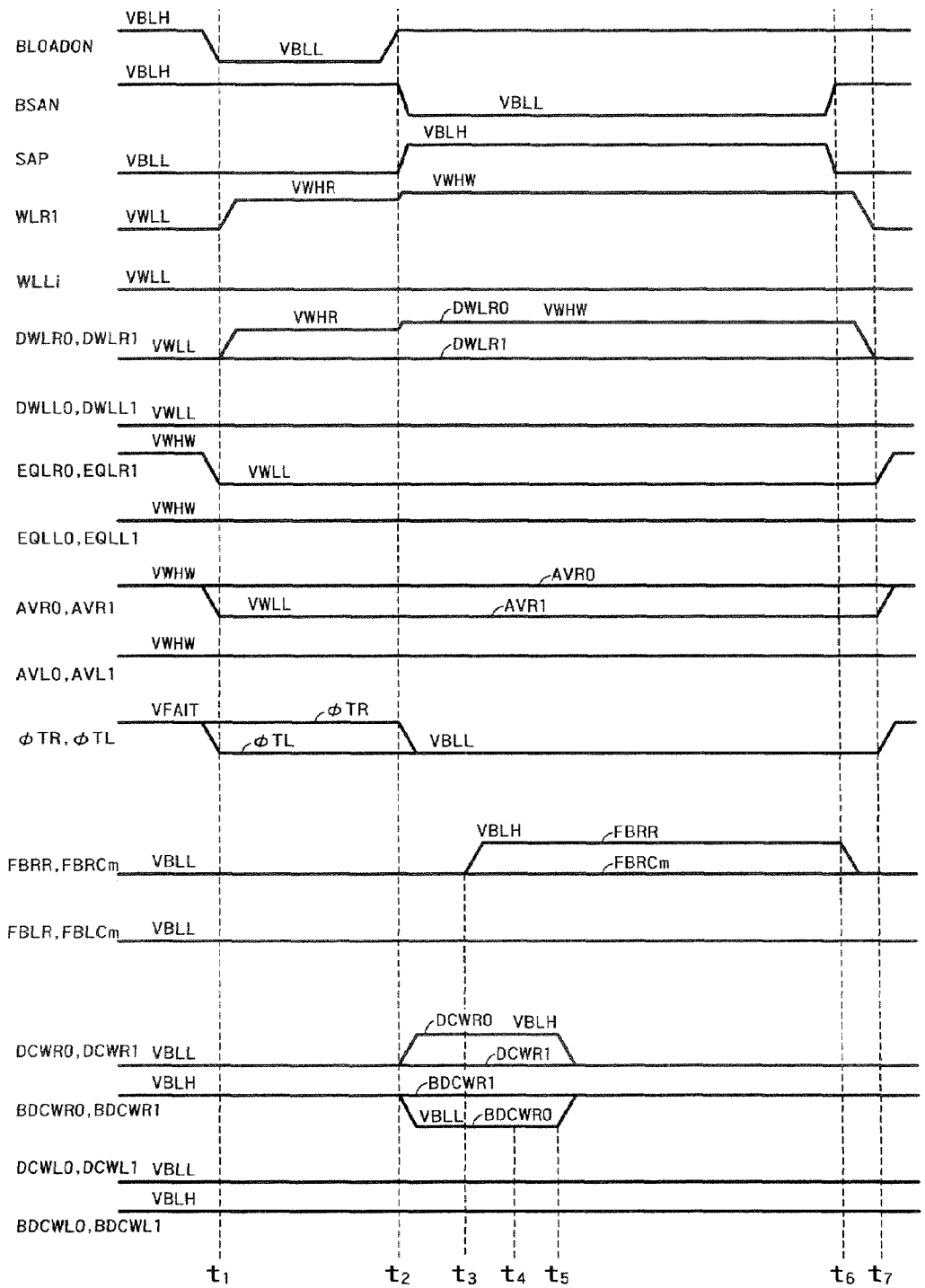
FIG. 22 is a timing diagram of signals concerning a data sense amplifier DSA in a normal refresh operation according to the second embodiment.

FIG. 22 is a timing diagram of signals concerning the data sense amplifier DSA in the normal refresh operation according to the second embodiment. FIG. 22 shows timings of the signals FBLR, FBRR, FBLCm, and FBRCm, in place of the signals FBL0R, FBL1R, FBR0R, FBR1R, FBL0Cm, FBL1Cm, FBR0Cm, and FBR1Cm shown in FIG. 12. Operations of other signals shown in FIG. 22 are the same as those of the signals shown in FIG. 12.

The data read operation during a period from t1 to t3 is the same as that according to the first embodiment, and therefore, is not explained herein. In the data write-back operation during a period from t3 to t5, the signal FBRR that extends in a row direction is activated to HIGH. Accordingly, all sense amplifiers SAs that are connected to the signal FBRR write back data into the memory cells connected to the selected word line. The word lines WLj are sequentially selected. Accordingly, the memory cells MCs within the memory cell array MCA are refreshed.

Figure 23:
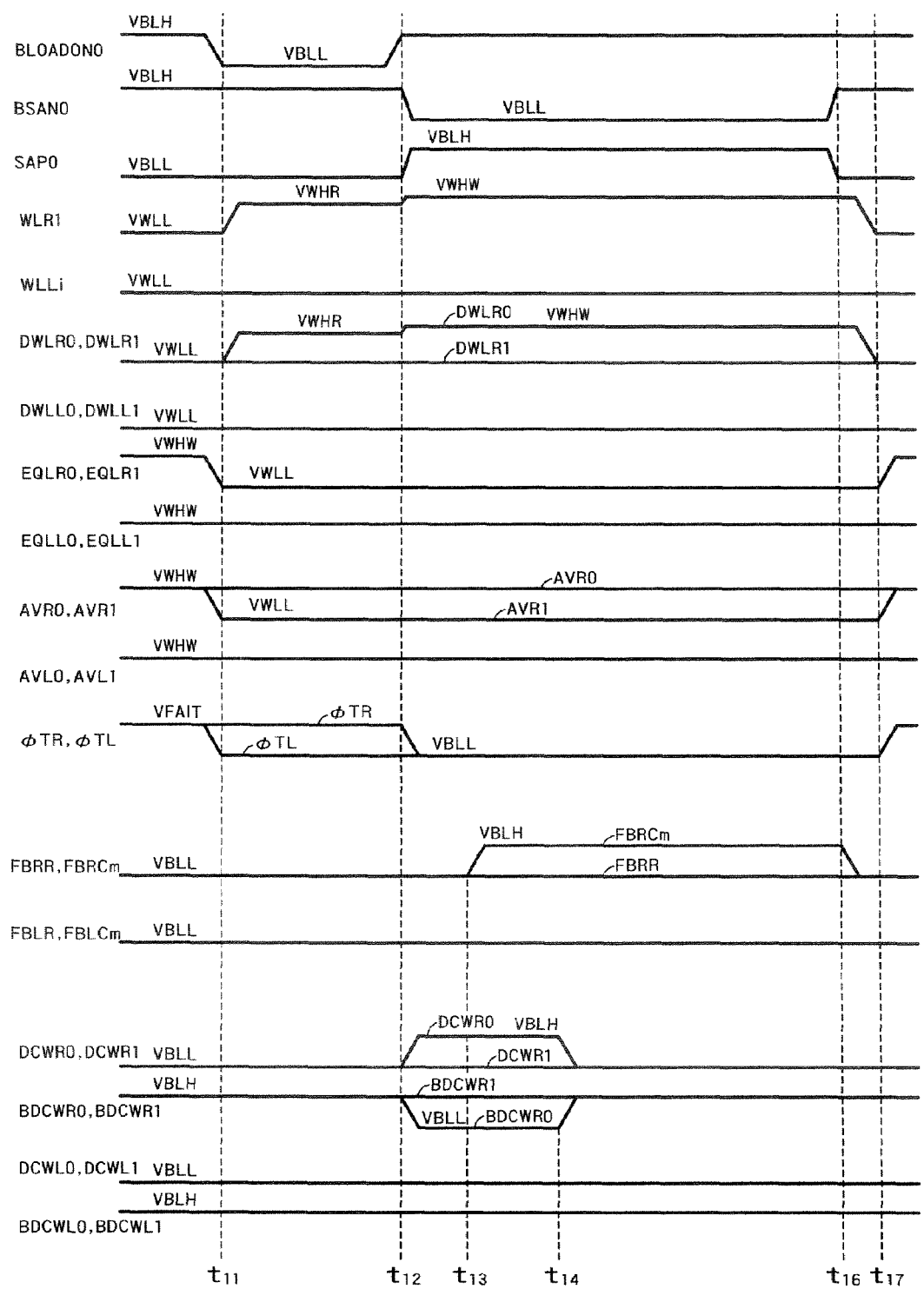
FIG. 23 is a timing diagram of signals concerning the data sense amplifier DSA in a read/write operation according to the second embodiment.

FIG. 23 is a timing diagram of signals concerning the data sense amplifier DSA in the read/write operation according to the second embodiment. In the read/write operation, the ad hoc refresh operation is not executed. FIG. 23 shows timings of the signals FBLR, FBRR, FBLCm, and FBRCm, in place of the signals FBL0R, FBL1R, FBR0R, FBR1R, FBL0Cm, FBL1Cm, FBR0Cm, and FBR1Cm shown in FIG. 14. Operations of other signals shown in FIG. 23 are the same as those of the signals shown in FIG. 14.

The data read operation during the period from t1 to t3 is the same as that according to the first embodiment, and therefore, is not explained here. In the write-back operation during a period from t3 to t5, the signal FBRCm that extends in a column direction is activated to HIGH. Accordingly, only the selected sense amplifier SA writes data into the selected memory cells. Other sense amplifiers SAs are connected to non-selected memory cells, and do not execute the data write operation. Therefore, in the second embodiment, power consumption can be suppressed in a similar manner to that in the first embodiment.

Figure 24:
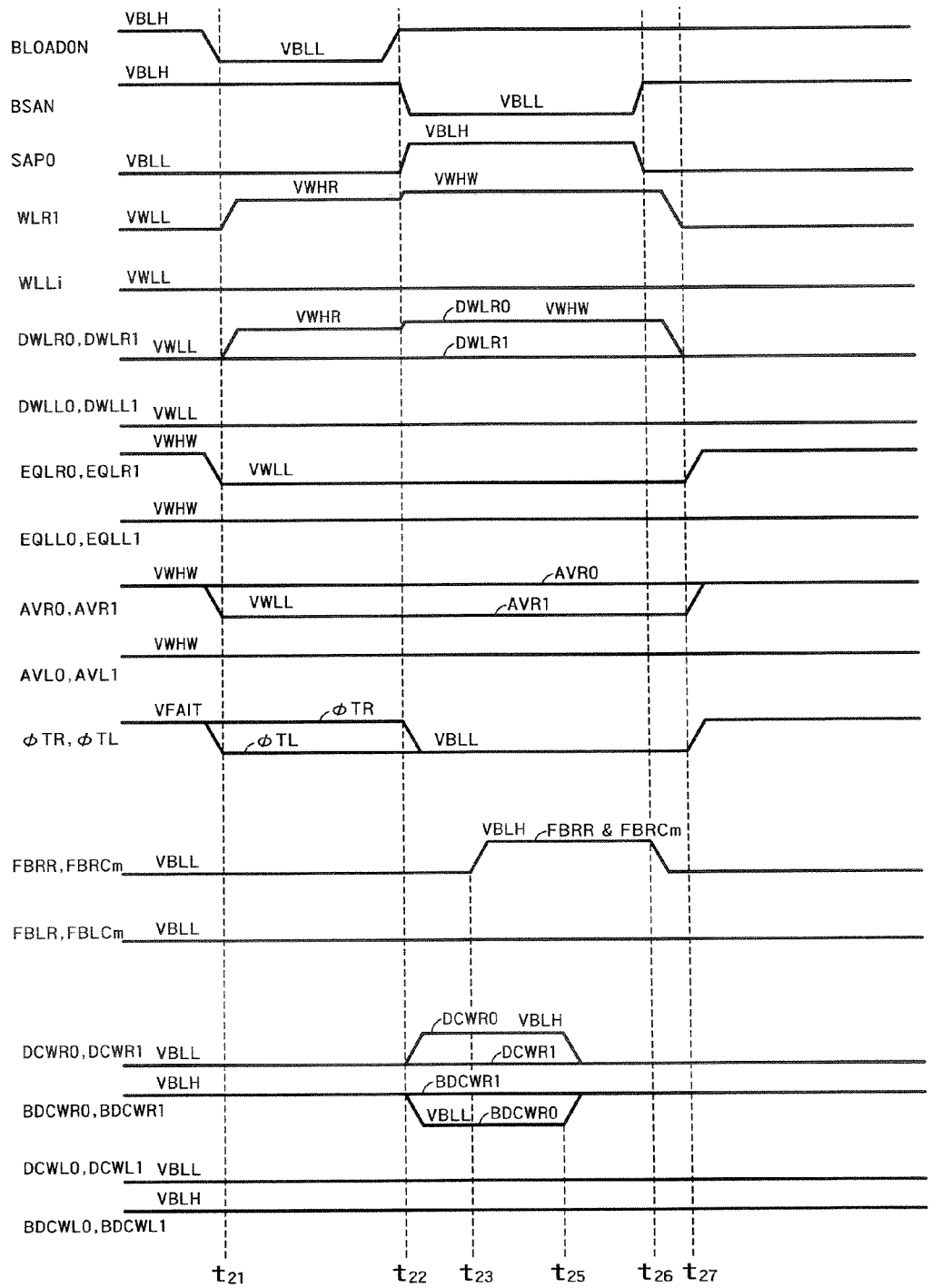
FIG. 24 is a timing diagram of the signals concerning the data sense amplifier DSA in the read/write operation according to the second embodiment.

FIG. 24 is a timing diagram of signals concerning the data sense amplifier DSA in the read/write operation according to the second embodiment. In the read/write operation, the ad hoc refresh operation is executed. FIG. 24 shows timings of the signals FBLR, FBRR, FBLCm, and FBRCm, in place of the signals FBL0R, FBL1R, FBR0R, FBR1R, FBL0Cm, FBL1Cm, FBR0Cm, and FBR1Cm shown in FIG. 16. Operations of other signals shown in FIG. 24 are the same as those of the signals shown in FIG. 16.

The data read operation during the period from t1 to t3 is similar to that according to the first embodiment, and therefore, is not explained here. In the data write-back operation during the period from t3 to t5, the signals FBRR and FBRCm are activated to HIGH. Accordingly, the selected sense amplifier SA writes (updates) data into the selected memory cell. Other sense amplifiers SAs write back data into the non-selected memory cells. As a result, all memory cells MCs that are connected to the selected word line WLj are refreshed. Consequently, it is possible to prevent the data "1" from being changed to the data "0" due to the charge pumping phenomenon.

The second embodiment has effects similar to those of the first embodiment.

Modification of the Second Embodiment

Figure 25:
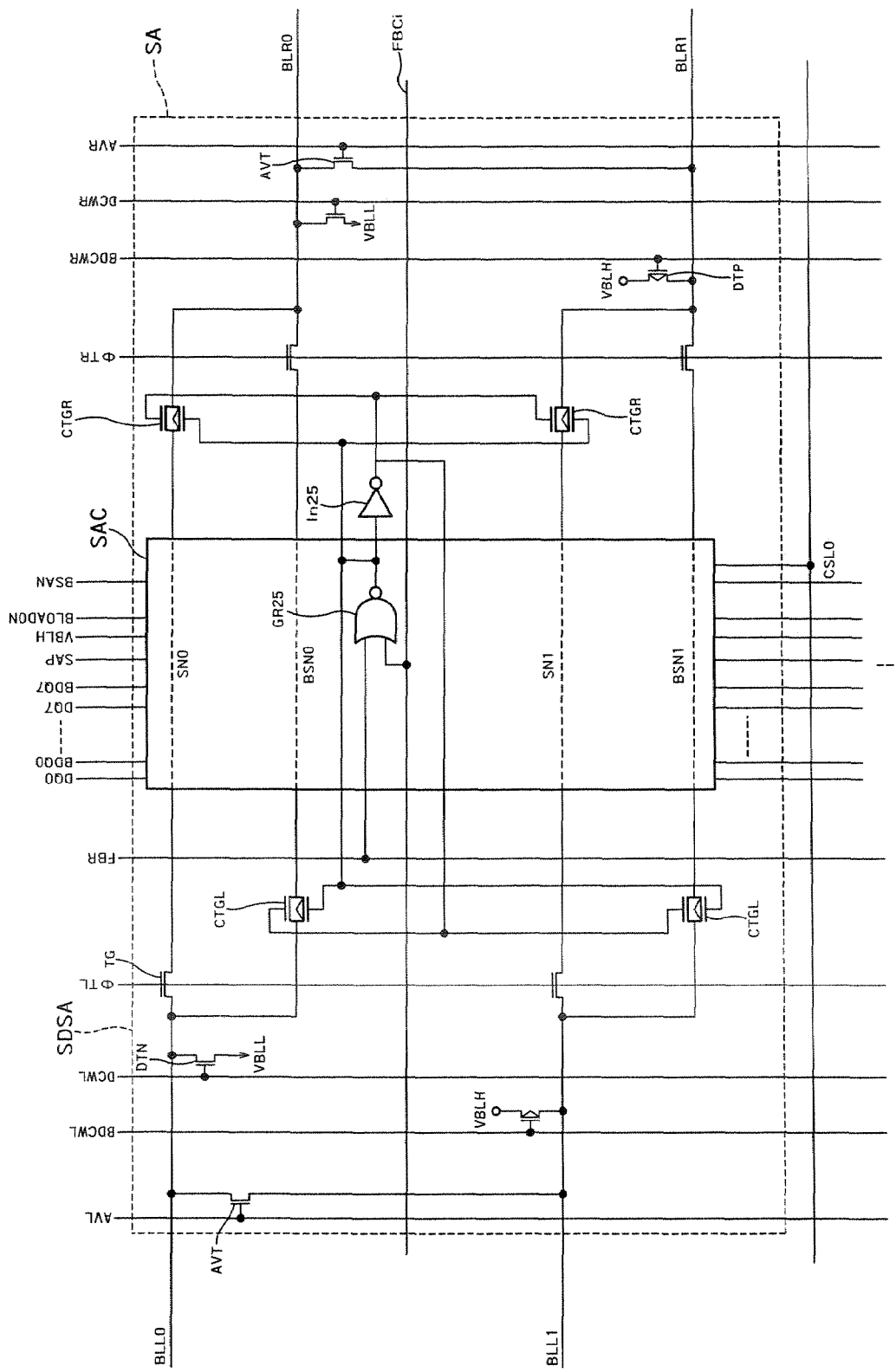
FIG. 25 is a circuit diagram of a data sense amplifier according to a modification of the second embodiment.

FIG. 25 is a circuit diagram showing a data sense amplifier according to a modification of the second embodiment. In the data sense amplifier DSA according to the present modification, the number of NOR gates and the number of inverters are smaller than those of the data sense amplifier DSA shown in FIG. 20.

An NOR gate G25 receives a signal FBC from a signal line that extends in a column direction, and receives a signal FBR from a signal line that extends in a row direction. The NOR gate G25 outputs a result of an NOR operation of the signal FBC and the signal FBR to gates of the transfer gates CTGL and CTGR.

An inverter In25 is connected to between an output of the NOR gate G25 and NMOS gates of the transfer gates CTGL, CTGR, respectively. Accordingly, the CMOS transfer gates CTGL and CTGR are controlled to either on or off. The NOR gate G25 and the inverter In25 connected to the output of the NOR gate can be provided either in the inside or at the outside of the sense amplifier core SAC.

In this modification, the FBC memory has an open-type bit line configuration similarly to the second embodiment. However, in the second embodiment, at the time of writing back data, the CMOS transfer gate connects only the data-side bit line for transmitting data, to the sense node, without connecting the dummy-side bit line for transmitting the reference potential, to the sense node.

In this modification, the CMOS transfer gate connects not only the data-side bit line but also the dummy-side bit line to the sense node. When the data-side bit line and the dummy-side bit line are driven together as a bit line pair, the number of NOR gates and the number of inverters can be reduced. Accordingly, a circuit scale of the FBC memory can be made small. However, in this modification, writing into the dummy cell DC needs to be prohibited at the data write-back time. This can be achieved, for example, when the dummy word line is inactivated.

Third Embodiment

Figure 26:
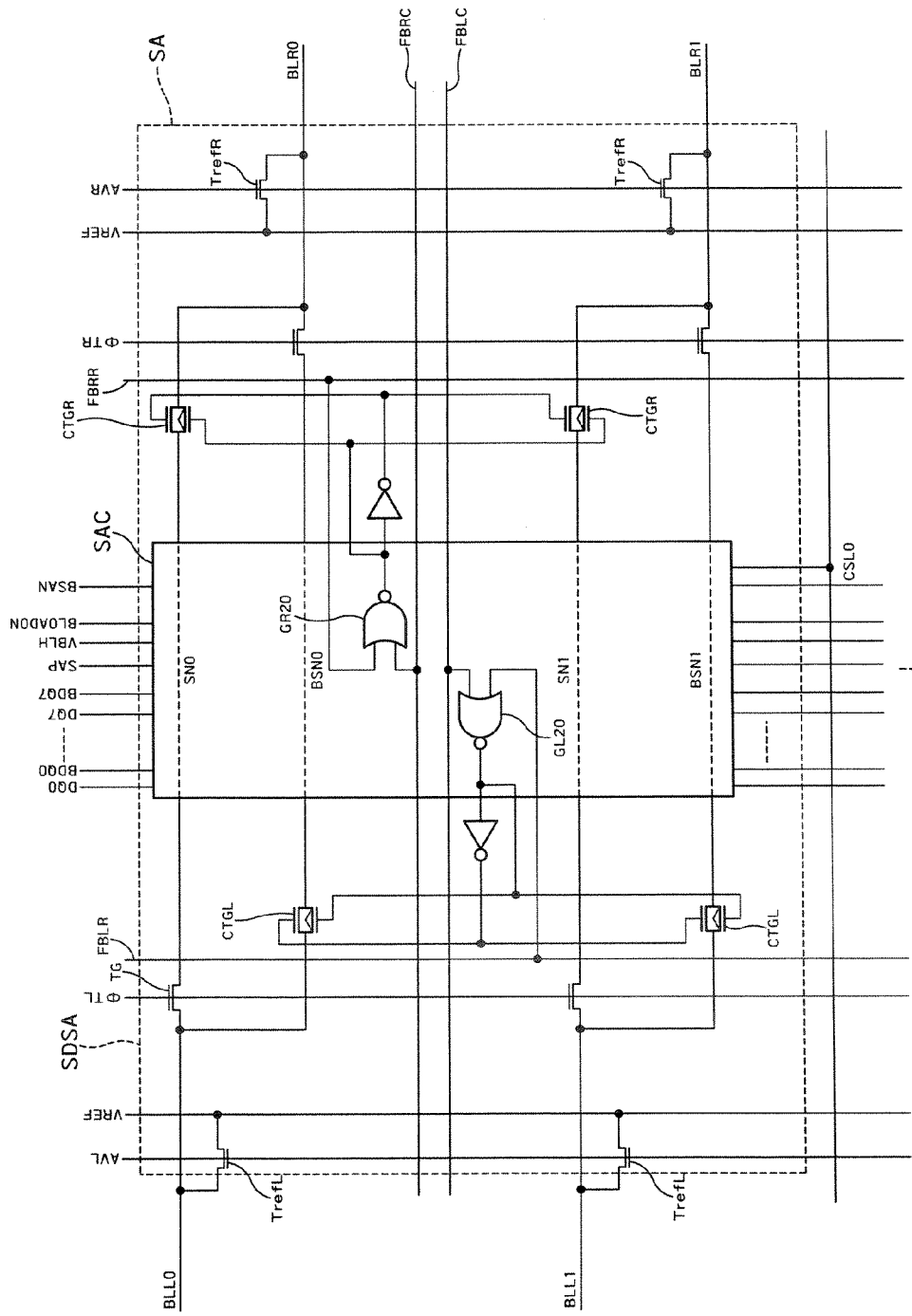
FIG. 26 is a circuit diagram of a sense amplifier SA according to a third embodiment of the present invention.

FIG. 26 is a circuit diagram of a sense amplifier SA according to a third embodiment of the present invention. The third embodiment is different from the second embodiment in that the reference voltage VREF is supplied from the outside of the sense amplifier SA and that NFETs and PFETs for dummy cell write are omitted. Other configurations of the third embodiment are the same as those of the second embodiment.

For example, when the bit line BLR0 is a data-side bit line, a signal AVL is activated to HIGH, and an NMOS transistor TrefL turns on. Accordingly, the bit line BLL0 transmits the reference voltage VREF. When the bit line BLL0 is a data-side bit line, the signal AVR is activated to HIGH, and the NMOS transistor TrefR becomes on. Accordingly, the bit line BLR0 transmits the reference voltage VREF.

The third embodiment has effects similar to those of the second embodiment. The modification of the second embodiment can be applied to the third embodiment. Accordingly, the third embodiment also has effects of the modification of the second embodiment.

In the first to the third embodiments, data that is activated by one time is stored in eight-bit counter cells CCs that belong to the same cell array. However, the data that is activated by one time can be also divided into one bit or plural bits, and the divided data can be stored in counter cells CCs that belong to plural cell arrays. For example, data of the number of times of activation can be divided into 8 one-bit-data, and these 8 one-bit-data can be stored in counter cells CC belonging to eight different cell arrays, respectively. Alternatively, data of the number of times of activation can be divided into 4 two-bit-data, and the 4 two-bit-data can be stored in counter cells CCs belonging to four different cell arrays. In this case, the eight-bit counter cells CCs provided in plural cell arrays are activated simultaneously.

Since the counter cells CCs are provided in plural cell arrays, the number of counter cells CCs belonging to each memory cell array MCA can be reduced. For example, when the counter cells CCs are provided in four cell arrays of which bits are different by two bits, the number of counter cells CCs belonging to each memory cell array MCA can be two bits per one word line. Accordingly, the area occupied by the counter cell CC can be made small. Consequently, the chip size can be reduced.

In the first to the third embodiments, the counter cell CC needs to be initialized before a semiconductor memory device is used, after the power supply is turned on. Initialization refers to logically changing data to the data "0" from the viewpoint of the signals DQ and BDQ. In order to initialize the counter cell CC, all word lines are refreshed before the semiconductor memory device is used after the power supply is turned on. More specifically, the refresh operation based on the signal CBR is repeated by the number of times when all word lines are started. In the case of a 4K refresh cycle product, the refresh operation is executed 4096 times. When one refresh operation requires 100 ns, a period required to execute the refresh operation is 4096×100 ns≅410 μs.

It is also possible to write "0" into the counter cells CCs that are connected to plural word lines, by activating these word lines at the same time. Accordingly, the reset operation can be carried out in a short time when the power supply is turned on. For example, in the case of the 4K refresh cycle product, the refresh operation is executed 1024 times at the time of simultaneously activating four word lines. When one refresh operation requires 100 ns, a period required to execute the refresh operation is 1024×100 ns≅102 μs.

Figure 27:
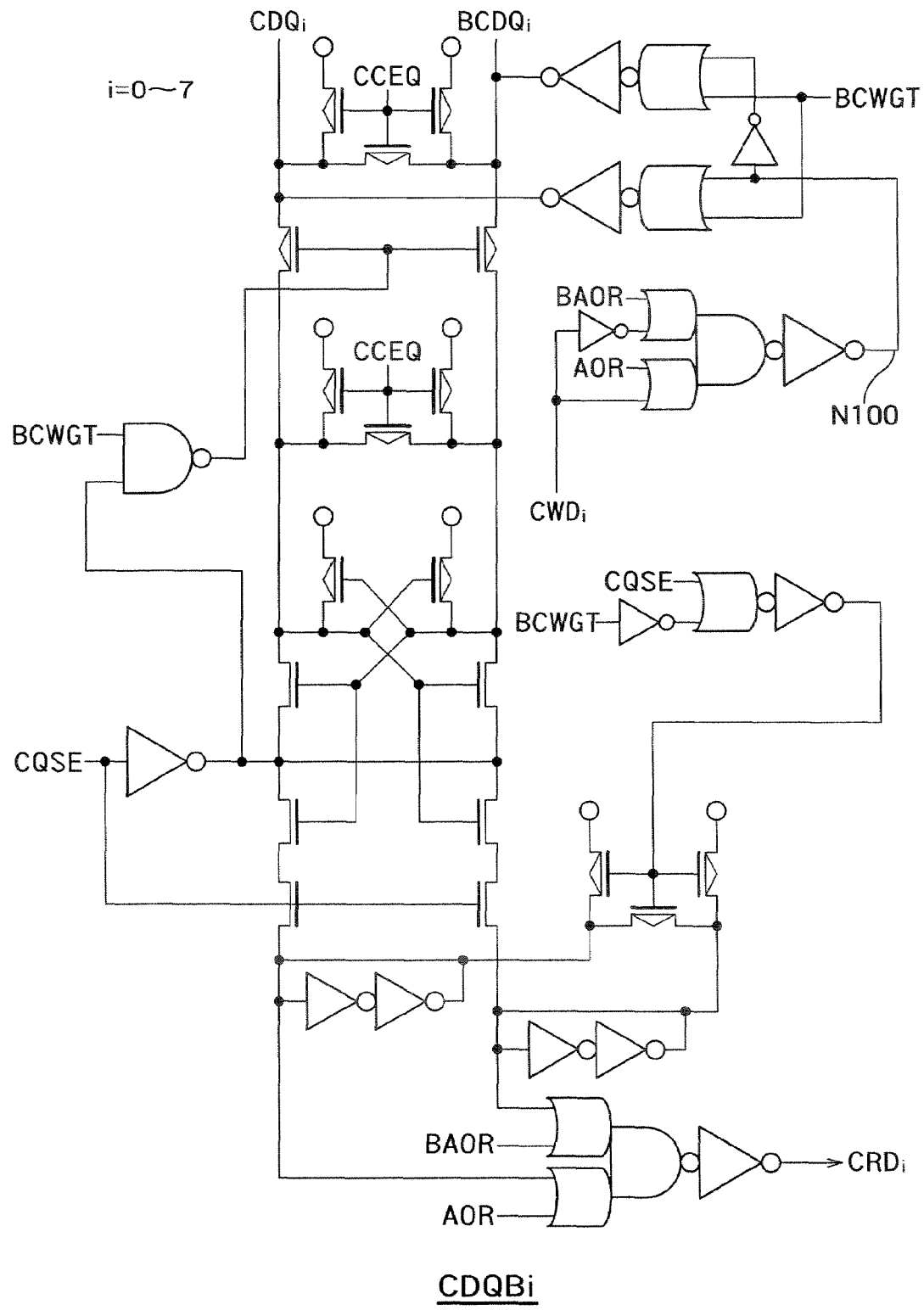
FIG. 27 is a diagram showing a modification of a counter DQ buffer CDQB.

FIG. 27 is a diagram showing a modification of the counter DQ buffer CDQB. According to this modification, the operation of initializing the counter cell CC (hereinafter, also "initial operation") becomes unnecessary. When power supply is turned on, the word line is maintained at a low voltage VWLL (for example, −1.5V when the source potential during the data holding time is 0V). Accordingly, after a sufficient time (about few seconds) has passed since the power supply is turned on, all data stored in all the counter cells CCs change to "1". This is because holes are stored in the floating body of the memory cells MCs due to a leak current.

In this case, while the logic of the memory cell connected to the bit line belonging to the DQ line is the same as the logic of the DQ line, the logic of the memory cell connected to the bit line belonging to the BDQ line is opposite to the logic of the DQ line. Therefore, in the semiconductor memory device having a folded bit line configuration according to the first embodiment, the logic of sending from the counter DQ buffer CDQB to the half adder HA and the logic of returning from the half adder HA to the counter DQ buffer CDQB need to be changed based on a least significant bit A0R of the row address.

For example, when the least significant bit A0R of the row address is data "1" (HIGH) and when the data "1" (HIGH) of the initial counter cell CC is transmitted to the signal line CDQi, BA0R becomes LOW, and the signal BCDQi becomes LOW. Therefore, the output CRDi to the adder becomes LOW. When the least significant bit A0R of the row address is data "0" (LOW) and when the data "1" (HIGH) of the initial counter cell CC is transmitted to the signal line BCDQi, A0R becomes LOW, and the signal CDQi becomes LOW. Therefore, the output CRDi to the adder also becomes LOW. In the initial state of the counter cell CC, all data become "1". Therefore, the initial value of the output CRDi of the count data becomes "00000000" in all the row addresses.

On the other hand, the input CWDi from the half adder HAi is also changed based on the least significant bit A0R. Among the count data, the input CWDi of the non-incremented bit is the data "0". When the least significant bit A0R is the data "1", the node N100 becomes HIGH. Therefore, the signal line CDQi becomes HIGH, and the data "1" is written into the counter cell CC that is connected to the signal line CDQi. When the least significant bit A0R is the data "0", the node N100 becomes LOW. Therefore, the signal line BCDQi becomes HIGH, and the data "1" is written into the counter cell CC that is connected to the signal line BCDQi.

Among the count data, the input CWDi of the incremented bit is the data "1". Therefore, when the least significant bit A0R is the data "1", the data "0" is written into the counter cell CC that is connected to the signal line CDQi. When the least significant bit A0R is the data "0", the data "0" is written into the counter cell CC that is connected to the signal line BCDQi.

As explained above, according to the modification shown in FIG. 27, the initial state (data "1") of all counter cells CCs is used to generate the initial state "00000000" of the count data, based on the least significant bit of the row address. The generated initial state can be output to the half adder HA. Further, according to the modification, among the count data from the half adder HA, the non-incremented bit can be written back into the counter cell CC in the initial state "0", based on the least significant bit of the row address. At the same time, the incremented bit can be changed to the data "1" different from the initial state, and this data can be written back into the counter cell CC.

FIG. 27 shows the counter DQ buffer CDQB corresponding to the semiconductor memory device having the folded bit line configuration. On the other hand, in the semiconductor memory device having the open bit line configuration, the logic of DQ and the logic of the counter cell CC are changed depending on which one of the left and right cell arrays of the sense amplifier, the counter cell CC belongs to. Therefore, A0R and BA0R shown in FIG. 27 are replaced by higher addresses A8R and BA8R, respectively, for example. A8R is an eleventh row address that determines left and right of a sense amplifier. For example, it is assumed that in case that A8R is LOW, the address indicates the memory cell array positioned a left-side of the sense amplifier, and that in case that A8R is HIGH, the address indicates the memory cell array positioned a right-side of the sense amplifier.

When the initial state (data "1") of all counter cells CCs is used without executing the initial set operation, time required for the data of the counter cells CCs to become "1" after turning-on is considered as few seconds at room temperature (up to 25° C.).

Figure 28:
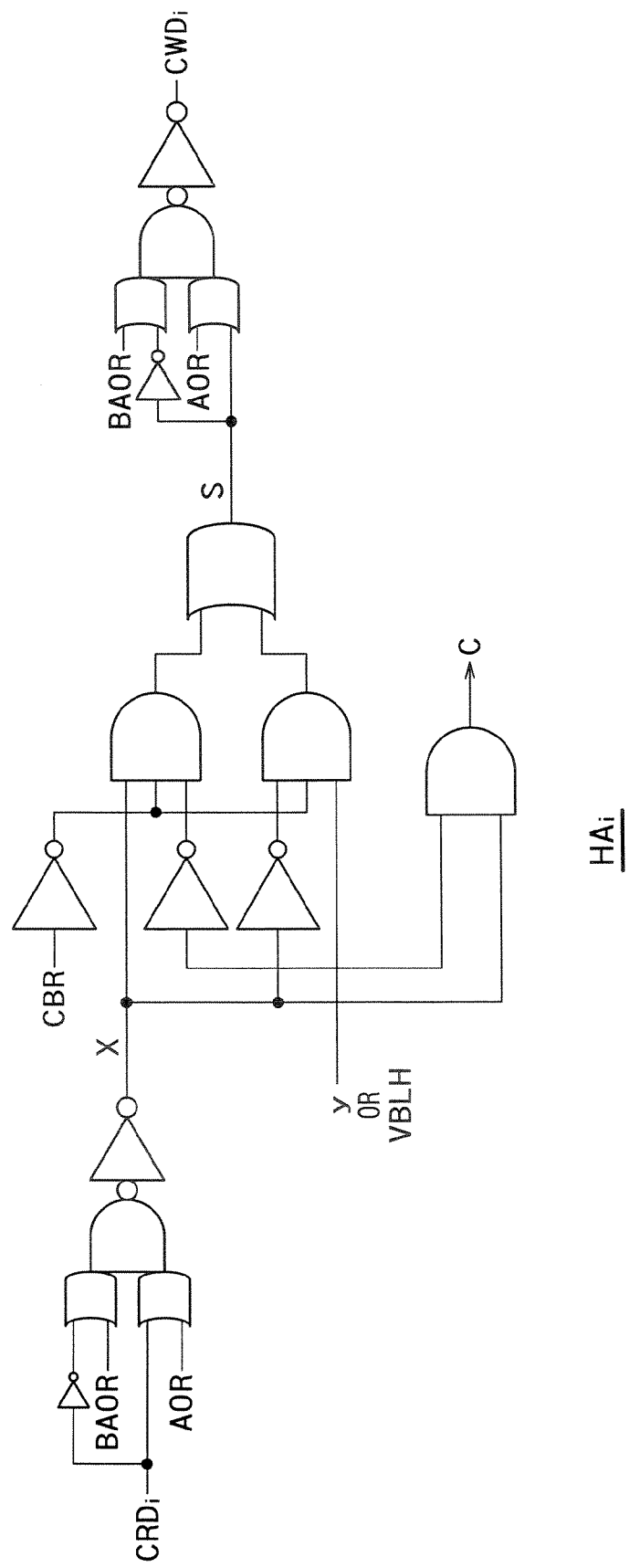
FIG. 28 is a circuit diagram showing a modification of the half adder HAi.

FIG. 28 is a circuit diagram showing a modification of the half adder HAi. In this case, the initial set operation is not necessary by changing the half adder HA shown in FIG. 9 to that shown in FIG. 28 while using the counter DQ buffer CDQBi shown in FIG. 8.

In the above embodiment, the effects of the embodiment are not lost even when the row direction and the column direction are replaced with each other.

In the above embodiment, the ad hoc refresh operation that is a measure to the charge pumping phenomenon is carried out by writing-back both polarity data "0" and "1", like the normal refresh operation. However, the charge pumping phenomenon has a characteristic that only the data "1" is degraded to the data "0". Accordingly, the ad hoc refresh operation may be the writing-back operation of only the data "1", unlike the normal refresh operation. Therefore, power of the ad hoc refresh operation can be decreased further. The data polarity means the data "0" and the data "1" in binary values.

The invention claimed is:
1. A semiconductor memory device, comprising:
   memory cells including floating bodies in an electrically floating state and storing data depending on the number of majority carriers within the floating bodies;
   a memory cell array including the memory cells disposed two dimensionally;
   word lines connected to the memory cell arrayed in rows of the memory cell array;
   bit lines connected to the memory cell arrayed in columns of the memory cell array;

a counter cell array including counter cells provided corresponding to the word lines and storing the number of times of activating the word lines;

an adder incrementing the number of times of activating the word lines which is read out from the counter cell array, when data is read or written in the memory cell;

a counter buffer circuit temporarily storing the number of times of activating the word lines which is read out from the counter cell array, and writing back the incremented number of times of activating the word lines into the counter cell array; and a sense amplifier executing a refresh operation for at least one polarity data when the number of times of activating one of the word lines has reached a predetermined value in a data read cycle in which data is read out from the sense amplifier to an outside of the memory cell array or in a data write cycle in which the sense amplifier receives data from the outside of the memory cell array and writes the data to the memory cell, the sense amplifier executing the refresh operation during the same data read cycle in which the number of times of activating of the one of the word lines has reached the predetermined value or during the same data write cycle in which the number of times of activating of the one of the word lines has reached the predetermined value, the refresh operation being an operation in which data is readout and the data readout is written back into the memory cell that originally stored the data.

2. The semiconductor memory device according to claim 1, wherein
when the number of times of activating one of the word lines does not reach a predetermined value in the data read cycle or the data write cycle, the sense amplifier does not execute the refresh operation, and reads data from the memory cell selected by the bit line as data to be read, or writes data into the memory cell selected by the bit line as data to be written.

3. The semiconductor memory device according to claim 1, wherein
sense amplifiers including the sense amplifier are provided corresponding to the bit lines, and comprises:
column signal lines provided corresponding to the sense amplifiers and extending in a column direction;
row signal lines provided in common to the sense amplifiers and extending in a row direction;
operating circuits logically calculating signals from the column signal lines and the row signal lines, respectively; and
transfer gates controlled by signals of results of calculation output from the operating circuits, the transfer gates connecting between the bit lines and the sense amplifiers during the refresh operation.

4. The semiconductor memory device according to claim 3, wherein
the operating circuits calculate signals from the column signal lines and the row signal lines, respectively.

5. The semiconductor memory device according to claim 3, wherein
the transfer gate includes an N-type FET and a P-type FET that are connected in parallel each other, and
the operating circuit outputs signals of mutually opposite phases to gates of an N-type FET and a P-type FET, respectively.

6. The semiconductor memory device according to claim 4, wherein
memory cell arrays including the memory cell array are disposed at both sides of the sense amplifiers, and the operating circuits are provided corresponding to the memory cell arrays.

7. The semiconductor memory device according to claim 4, wherein
memory cell arrays including the memory cell array are disposed at both sides of the sense amplifiers, and
one operating circuit is provided for the memory arrays at the both sides of the sense amplifiers.

8. The semiconductor memory device according to claim 3, wherein
when the number of times of activating one of the word lines reaches a predetermined value in a data read cycle or a data write cycle, the row signal lines are activated in the read cycle or the write cycle.

9. The semiconductor memory device according to claim 3, wherein
when the number of times of activating one of the word lines does not reach a predetermined value in a certain read cycle or a certain write cycle, the row signal lines remain inactive.

10. The semiconductor memory device according to claim 8, wherein
when the number of times of activating one of the word lines does not reach a predetermined value in a certain read cycle or a certain write cycle, the row signal lines remain inactive.

11. The semiconductor memory device according to claim 3, further comprising:
a row feedback circuit outputting a signal based on a row address to the row signal lines, and activating the row signal lines, when the number of times of activating one of the word lines reaches a predetermined value in a data read cycle or a data write cycle.

12. The semiconductor memory device according to claim 3, further comprising:
a row feedback circuit keeping the row signal lines inactive, regardless of a row address, when the number of times of activating the word line does not reach a predetermined value in a data read cycle or a data write cycle.

13. The semiconductor memory device according to claim 11, further comprising:
a row feedback circuit keeping the row signal lines inactive, regardless of a row address, when the number of times of activating the word line does not reach a predetermined value in a data read cycle or a data write cycle.

14. The semiconductor memory device according to claim 11, wherein
the row feedback circuit includes a delay circuit which operates according to a request signal of the refresh operation.

15. The semiconductor memory device according to claim 13, wherein
the row feedback circuit includes a delay circuit which operates according to a request signal of the refresh operation.

16. The semiconductor memory device according to claim 1, wherein
the sense amplifiers executes the refresh operation at the same timing as that of the data write cycle of writing data into the counter cells.

17. The semiconductor memory device according to claim 1, wherein
the counter cell array stores the number of times of activation as a digital data.

18. The semiconductor memory device according to claim 1, wherein the number of times of activating of the word lines is reset by the refresh operation.

19. The semiconductor memory device according to claim 1, wherein
the memory cell is made of a floating body cell.

20. The semiconductor memory device according to claim 2, wherein
the memory cell is made of a floating body cell.

* * * * *